(12) United States Patent
Yu et al.

(10) Patent No.: US 12,040,753 B2
(45) Date of Patent: Jul. 16, 2024

(54) DIGITAL PREDISTORTION WITH NEURAL-NETWORK-ASSISTED PHYSICAL MODELING OF ENVELOPE FEATURES

(71) Applicant: Analog Devices, Inc., Wilmington, MA (US)

(72) Inventors: Tao Yu, Needham Heights, MA (US); Christopher Mayer, Dover, MA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/948,482

(22) Filed: Sep. 20, 2022

(65) Prior Publication Data

US 2023/0370023 A1 Nov. 16, 2023

Related U.S. Application Data

(60) Provisional application No. 63/341,746, filed on May 13, 2022.

(51) Int. Cl.
*H03F 1/32* (2006.01)
*G05B 13/02* (2006.01)

(52) U.S. Cl.
CPC ......... *H03F 1/3247* (2013.01); *G05B 13/027* (2013.01)

(58) Field of Classification Search
CPC ............................ H03F 1/3247; G05B 13/027
USPC ...................................................... 375/296
See application file for complete search history.

(56) References Cited

U.S. PATENT DOCUMENTS

| | | | |
|---|---|---|---|
| 9,455,760 B1 | 9/2016 | Dick et al. | |
| 2004/0145501 A1* | 7/2004 | Hung | G06T 3/4023 341/61 |
| 2011/0204975 A1* | 8/2011 | Miyashita | H03F 1/3258 330/149 |
| 2013/0072139 A1* | 3/2013 | Kang | H04B 1/0028 455/114.3 |
| 2014/0241462 A1* | 8/2014 | Bellaouar | H04B 1/0483 375/297 |
| 2022/0052651 A1 | 2/2022 | Khlat | |

FOREIGN PATENT DOCUMENTS

EP 1280273 A2 1/2003
EP 1978696 A2 10/2008

OTHER PUBLICATIONS

Kingma et al., *Adam: A Method for Stochastic Optimization*, Published as a conference paper at ICLR 2015, 15 pages.
(Continued)

*Primary Examiner* — Kevin M Burd
(74) *Attorney, Agent, or Firm* — Knobbe, Martens, Olson & Bear, LLP

(57) ABSTRACT

Systems, devices, and methods related to envelope regulated, digital predistortion (DPD) are provided. An example apparatus includes an envelope regulator circuit to process, based on a parameterized model, an input signal to generate an envelope regulated signal; a digital predistortion (DPD) actuator circuit to process the envelope regulated signal and the input signal based on DPD coefficients associated with a nonlinearity characteristic of a nonlinear component; and a DPD adaptation circuit to update the DPD coefficients based on a feedback signal indicative of an output of the nonlinear component.

20 Claims, 10 Drawing Sheets

(56) References Cited

OTHER PUBLICATIONS

Paszke et al., *Automatic Differentiation in PyTorch*, 31st Conference on Neural Information Processing Systems (NIPS 2017), Long Beach, CA, US, 4 pages.
Extended European Search Report issued in European Patent Application No. 23169785.5, dated Oct. 11, 2023.

\* cited by examiner

DIGITAL PREDISTORTION WITH NEURAL-NETWORK-ASSISTED PHYSICAL MODELING OF ENVELOPE FEATURES

CROSS REFERENCE TO RELATED APPLICATIONS

The present application claims priority to and the benefit of U.S. Provisional Patent Application No. 63/341,746 entitled "DIGITAL PREDISTORTION WITH NEURAL-NETWORK-ASSISTED PHYSICAL MODEL FOR POWER AMPLIFIER DRAIN INDUCTOR RESONANCE MITIGATION" and filed May 13, 2022, which is hereby incorporated by reference in its entirety as if fully set forth below and for all applicable purposes.

TECHNICAL FIELD OF THE DISCLOSURE

The present disclosure generally relates to electronics, and more particularly to digital predistortion (DPD).

BACKGROUND

RF systems are systems that transmit and receive signals in the form of electromagnetic waves in the RF range of approximately 3 kilohertz (kHz) to 300 gigahertz (GHz). RF systems are commonly used for wireless communications, with cellular/wireless mobile technology being a prominent example, but may also be used for cable communications such as cable television. In both of these types of systems, linearity of various components therein plays a crucial role.

Linearity of an RF component or a system such as an RF transceiver is easy to understand in theory. Namely, linearity generally refers to the ability of a component or a system to provide an output signal that is directly proportional to an input signal. In other words, if a component or a system is perfectly linear, the relationship of a ratio of the output signal to the input signal is a straight line. Achieving this behavior in real-life components and systems is far more complicated and many challenges to linearity must be resolved, often at the expense of some other performance parameter, such as efficiency and/or output power.

Made from semiconductor materials, which are inherently nonlinear, and having to operate at relatively high power levels, power amplifiers (PAs) are usually the first components to analyze when considering a design of an RF system in terms of linearity. PA outputs with nonlinear distortions can result in reduced modulation accuracy (e.g., reduced error vector magnitude (EVM)) and/or out-of-band emissions. Therefore, both wireless RF systems (e.g., Long Term Evolution (LTE) and millimeter-wave or 5th generation (5G) systems) and cable RF systems have stringent specifications on PA linearity.

DPD can be applied to enhance linearity of a PA. Typically, DPD involves applying, in the digital domain, predistortion to a signal to be provided as an input to a PA to reduce and/or cancel distortion that is expected to be caused by the PA. The predistortion can be characterized by a PA model. The PA model can be updated based on the feedback from the PA (i.e., based on the output of the PA). The more accurate a PA model is in terms of predicting the distortions that the PA will introduce, the more effective the predistortion of an input to the PA will be in terms of reducing the effects of the distortion caused by the amplifier.

Performing DPD in RF systems is not an easy task because a variety of factors can affect the cost, quality and robustness of DPD. Physical constraints such as space/surface area and also regulations can pose further constraints to the requirements or specifications of DPD. DPD becomes particularly challenging because of ever-increasing sampling rates used in state-of-the-art RF systems, and thus trade-off and ingenuity have to be exercised in designing DPD.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1A:
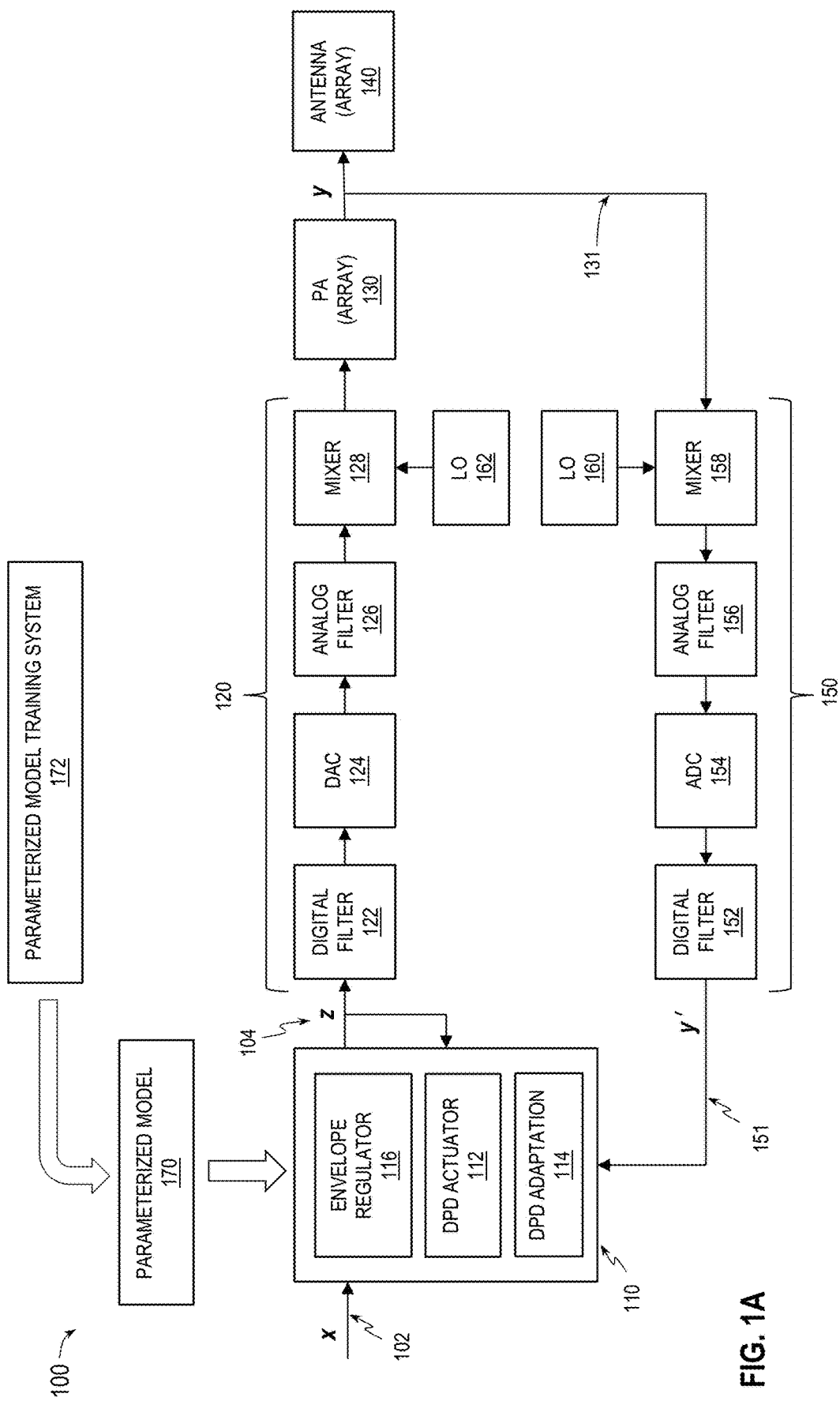
FIG. 1A provides a schematic block diagram of an exemplary radio frequency (RF) transceiver in which parameterized model-based digital predistortion (DPD) may be implemented, according to some embodiments of the present disclosure.

The systems, methods and devices of this disclosure each have several innovative embodiments, no single one of which is solely responsible for all of the desirable attributes disclosed herein. Details of one or more implementations of the subject matter described in this specification are set forth in the description below and the accompanying drawings.

For purposes of illustrating DPD using neural networks, proposed herein, it might be useful to first understand phenomena that may come into play in RF systems. The following foundational information may be viewed as a basis from which the present disclosure may be properly explained. Such information is offered for purposes of explanation only and, accordingly, should not be construed in any way to limit the broad scope of the present disclosure and its potential applications.

As described above, PAs are usually the first components to analyze when considering a design of an RF system in terms of linearity. Having linear and efficient PAs is essential for wireless and cable RF systems. While linearity is also important for small-signal amplifiers such as low-noise amplifiers, the challenges of linearity are particularly pronounced for PAs because such amplifiers are typically required to produce relatively high levels of the output power and are, therefore, particularly susceptible to entering certain operating conditions where nonlinear behavior can no longer be ignored. On one hand, the nonlinear behavior of semiconductor materials used to form amplifiers tends to worsen when the amplifiers operate on signals with high power levels (an operating condition commonly referred to as "operating in saturation"), increasing the amount of nonlinear distortions in their output signals, which is highly undesirable. On the other hand, amplifiers operating at relatively high power levels (i.e., operating in saturation) also typically function at their highest efficiency, which is highly desirable. As a result, linearity and efficiency (or power level) are two performance parameters for which, often, an acceptable trade-off has to be found in that an improvement in terms of one of these parameters comes at the expense of the other parameter being suboptimal. To that end, the term "back-off" is used in the art to describe a measure of how far the input power (i.e., the power of a signal provided to the amplifier to be amplified) should be reduced in order to realize the desired output linearity (e.g., back-off may be measured as a ratio between the input power that delivers maximum power to the input power that delivers the desired linearity). Thus, reducing the input power may provide an improvement in terms of linearity but results in a decreased efficiency of the amplifier.

As also described above, DPD can pre-distort an input to a PA to reduce and/or cancel distortion caused by the amplifier. To realize this functionality, at a high level, DPD involves forming a model of how a PA may affect an input signal, the model defining coefficients of a filter to be applied to the input signal (such coefficients referred to as "DPD coefficients") in an attempt to reduce and/or cancel distortions of the input signal caused by the amplifier. In this manner, DPD will try to compensate for the amplifier applying an undesirable nonlinear modification to the signal to be transmitted, by applying a corresponding modification to the input signal to be provided to the amplifier.

Models used in DPD algorithms are typically adaptive models, meaning that they are formed in an iterative process by gradually adjusting the coefficients based on the comparison between the data that comes into the input to the amplifier and the data that comes out from the output of the amplifier. Estimation of DPD coefficients is based on acquisition of finite sequences of input and output data (i.e., input to and output from a PA), commonly referred to as "captures," and formation of a feedback loop in which the model is adapted based on the analysis of the captures. More specifically, conventional DPD algorithms are based on General Memory Polynomial (GMP) models that involve forming a set of polynomial equations commonly referred to as "update equations," and searching for suitable solutions to the equations, in a broad solution space, to update a model of the PA. To that end, DPD algorithms solve an inverse problem, which is the process of calculating, from a set of observations, the casual factors that produced these observations.

Solving inverse problems in the presence of nonlinear effects can be challenging and may be ill-posed. In particular, inventors of the present disclosure realized that GMP-based PA models may have limitations due to signal dynamics and limited memory depth required to store polynomial data, especially in presence of the ever-increasing sampling rates used in state-of-the-art RF systems and high-power PAs that are present at macro base stations.

Solid-state devices that can be used in high frequency are of great importance in modern semiconductor technologies. Due, in part, to their large band gap and high mobility, III-N based transistors (i.e., transistors that employ compound semiconductor materials with a first sub-lattice of at least one element from group III of the periodic table (e.g., Al, Ga, In) and a second sub-lattice of nitrogen (N) as channel materials), such as GaN based transistors, may be particularly advantageous for high frequency applications. In particular, PAs may be built using GaN transistors.

While GaN transistors have desirable features in terms of cut-off frequency and efficiency, their behavior is complicated by an effect known as charge trapping, where defect sites in the transistor channel trap charge carriers. The density of trapped charges is largely dependent on the gate voltage, where the gate voltage is typically proportional to the signal amplitude. To complicate things further, an opposite effect may simultaneously compete with the effect of charge trapping. Namely, as some charge carriers are trapped by defect sites, other charge carriers are released from the traps, e.g., due to thermal activation. These two effects have vastly different time constants: the defect sites may be filled with trapped charges quickly any time the gate voltage is increased, while the release of trapped charges happens more slowly. The release time constants can be 10's of microseconds and up to milliseconds, with the effect typically being very visible on the time scale of the symbol periods in 4G or 5G data, especially for data that contains bursts.

Various DPD improvements for operating under 5G wireless communications have been made. For instance, to improve 5G transceivers in handling wideband distortions with complex frequency-dependent behavior, higher order nonlinear terms have been introduced. However, PAs at macro base stations are typically high-power PAs (e.g., with an output power of 40 watts (W) or more) so that a sufficient area coverage may be provided. These high-power PAs can introduce new challenges. For example, the release of trapped charges may occur at a faster time scale, for example, from hundreds of nanoseconds to tens of microseconds. Further, the drain bias of a high-power PA may be typically 28-50 volt (V) direct-current (DC) supplied through a bias network with a large inductance to sustain a high current draw when complicated waveforms (e.g., wideband signals with a high slew rate or a fast-switching waveforms) are being transmitted. The typical drain bias network may feed direct-current low-frequency (DC/LF) current using a quarter wavelength line/RF short while blocking RF with a minimal RF loading of the power transistor output. However, the finite bias feed inductor may oscillate with the drain decoupling capacitors when an envelope bandwidth (BW) current pulse is provided to the high-power PA. This oscillation may in turn cause ringing effects at the output of the high-power PA. The ringing effects may be in the form of gain oscillations, which may be nonlinear. In some examples, the memory effect due to the drain voltage resonance may last for about 4-6 microseconds, which may be much longer than the typical range handled by a DPD (e.g., a DPD for a 5G transceiver). Further, the ringing effects may result in unwanted out-of-band emission that fails to satisfy certain regulations (e.g., defined by Federal Communications Commission). Accordingly, it may be beneficial to mitigate the undesirable effects from the PA drain inductor resonance.

Various embodiments of the present disclosure provide systems and methods that aim to improve on one or more of the challenges and/or drawbacks described above in providing linear and efficient amplifiers (such as, but not limited to, PAs) for RF systems (such as, but not limited to, wireless RF systems of millimeter-wave/5G technologies). In particular, aspects of the present disclosure provide techniques for using machine learning (e.g., a neural network) to model the complex mapping between PA drain voltages and gain oscillations so that the ringing effects (or PA gain oscillations) from the PA drain voltages may be mitigated, for example, prior to DPD actuation.

Aspects of the present disclosure provides an apparatus for applying DPD to an input signal for a nonlinear component. The nonlinear component may be a high-power PA and may have the gain oscillation (or gain variation) issues due to PA drain inductor resonance as discussed above. To precompensate for the gain oscillations, the apparatus may include an envelope regulator circuit, a DPD actuator circuit, and a DPD adaptation circuit. The envelope regulator circuit may process an envelope (e.g., amplitudes) of the input signal based on a parameterized model to generate an envelope regulated signal (e.g., a gain oscillation precompensated signal). The DPD actuator circuit may process the envelope regulated signal and the input signal based on DPD coefficients associated with a nonlinear characteristic of the nonlinear component. The DPD adaptation circuit may update the DPD coefficients based on a feedback signal indicative of an output of the nonlinear component.

In some aspects, the envelope regulator circuit may include a gain regulation model associated with a voltage variation of the nonlinear component, and the apparatus may further include a control block (e.g., hardware control registers) to configure the gain regulation model based on the parametrized model. In some aspects, the gain regulation model in the envelope regulator circuit may be based on a drain inductor resonance of the nonlinear component. In some aspects, the gain regulation model in the envelope regulator circuit may include a lookup table (LUT) generated based on the parameterized model. The LUT may be a two-dimensional (2D) LUT that maps the voltage variation of the nonlinear component and an envelope (e.g., an instantaneous envelope) of the input signal to a gain value.

In some aspects, the drain bias feed for the PA may be modeled by a finite impulse response (FIR). Accordingly, the envelope regulator circuit may further include a filter (e.g., an FIR filter) upstream of the gain regulation model, the control block may further configure the filter based on the parameterized model, and the envelope regulator circuit may process the envelope of the input signal further based on the filter. In some instances, the filter may model at least one of an input signal envelope or an input voltage variation associated with the nonlinear component. In some aspects, the DPD actuator circuit may operate at a sampling rate at which the input signal is sampled while the filter may operate at a lower sampling rate than the input signal sampling rate (e.g., at a decimated sampling rate so that the computational load may be reduced). In this regard, the envelope regulator circuit may further include a downsampler upstream of the filter and an upsampler downstream of the filter, and the control block may further configure the downsampler and the upsampler based on the parameterized model.

In some aspects, the envelope regulator circuit may include a first path (signal path) and a second path (signal path) arranged in parallel with the first path. The first path may include a first downsampler, a first filter, a first upsampler, and a first voltage variation and signal envelope to gain mapping table (which may be a 2D LUT that maps voltage variation and signal envelope to gain values). Similarly, the second path may include a second downsampler, a second filter, a second upsampler, and a second voltage variation and signal envelope to gain mapping table (which may be a 2D LUT that maps voltage variation and signal envelope to gain values). The first voltage variation and signal envelope to gain mapping table may be different from the second voltage variation and signal envelope to gain mapping table. Additionally or alternatively, the first downsampler and the second downsampler may be based on different downsampling factors. Additionally or alternatively, the first upsampler and the second upsampler may be based on different upsampling factors. Additionally or alternatively, the first filter and the second filter may be different filters (having different filter coefficients).

In some aspects, the parameterized model may be a neural network trained offline. For instance, a computer-implemented system may implement a method for training the parameterized model to provide envelope regulation so that the PA gain oscillation caused by the PA drain inductor resonance can be mitigated. The computer-implemented system may receive a data set including one or more data pairs, each including an input signal and an observed signal associated with a PA (e.g., a high-power PA). For instance, the input signal and the observed signal may be collected from a target hardware. The computer-implemented system may further train the parameterized model based on the data set. As part of training the parameterized model, the computer-implemented system may update at least one parameter of the parameterized model associated with configuring a plurality of processing units associated with an envelope regulator circuit. The method may include outputting, based on the training, one or more configurations for the plurality of processing units associated with the envelope regulator circuit.

In some aspects, the computer-implemented system may generate the parameterized model. As part of generating the parameterized mode, the computer-implemented system may generate a mapping between each of the plurality of processing units associated with the envelope regulator circuit to one of a plurality of differentiable functional blocks.

In some aspects, the envelope regulation for the nonlinear component may include a sequence of operations, where the computer-implemented system may further calculate a parameter for each operation in the sequence of operations. In some aspects, the calculating the parameter for each operation in the sequence of operations is further based on a backpropagation process and a loss function. In some aspects, the sequence of operations of the envelope regulation for the nonlinear component may include at least one of a downsampling operation, a filtering operation, an upsampling operation, or a PA drain voltage-to-gain mapping operation.

The systems, schemes, and mechanisms described herein advantageously uses a physical model with the assistance of a neural network to model the drain inductor resonance of macro base station PAs (high-power PAs). The physical construction may enable the model to significantly improve DPD performance while keeping the model both compact and interpretable. The disclosed embodiments can also benefit digital implementation using lightweight components (e.g., processing components). The disclosed embodiments further provide a successful adoption of data-driven approach in conventional modeling space where numerical models, such as neural network, bring new perspective in improving the physical models. While the present disclosure is discussed in the context of modelling the physical behavior of drain inductor resonance in high-power PAs using neural network(s) and configuring a target hardware to precompensate the behavior based on the model, the disclosed techniques may be applicable for use in modelling any type of physical behavior of a component (e.g., a nonlinear component) and configuring a target hardware to compensate the behavior based on the model.

Example RF Transceivers with DPD Arrangement

FIG. 1A provides a schematic block diagram of an exemplary RF transceiver 100 in which parameterized model-based envelope regulated, DPD may be implemented, according to some embodiments of the present disclosure. As shown in FIG. 1A, the RF transceiver 100 may include a DPD circuit 110, a transmitter circuit 120, a PA 130, an antenna 140, and a receiver circuit 150.

The DPD circuit 110 is configured to receive an input signal 102, represented by x, which may be a sequence of digital samples and which may be a vector. In general, as used herein, each of the lower case, bold italics single-letter labels used in the present figures (e.g., labels x, z, y, and y', shown in FIG. 1A), refers to a vector. In some embodiments, the input signal 102 $x$ may include one or more active channels in the frequency domain, but, for simplicity, an input signal with only one channel (i.e., a single frequency range of in-band frequencies) is described. In some embodiments, the input signal x may be a baseband digital signal. The DPD circuit 110 is configured to generate an output signal 104, which may be represented by z, based on the input signal 102 $x$. The DPD output signal 104 $z$ may be provided further to the transmitter circuit 120. To that end, the DPD circuit 110 may include a DPD actuator 112 and a DPD adaptation circuit 114. In some embodiments, the actuator 112 may be configured to generate the output signal 104 $z$ based on the input signal 102 $x$ and DPD coefficients c, computed by the DPD adaptation circuit 114, as described in greater detail below.

The transmitter circuit 120 may be configured to upconvert the signal 104 $z$ from a baseband signal to a higher frequency signal, such as an RF signal. The RF signal generated by the transmitter 120 may be provided to the PA 130, which may be implemented as a PA array that includes N individual PAs. The PA 130 may be configured to amplify the RF signal generated by the transmitter 120 (thus, the PA 130 may be driven by a drive signal that is based on the output of the DPD circuit 110) and output an amplified RF signal 131, which may be represented by y (e.g., a vector).

In some embodiments, the RF transceiver 100 may be a wireless RF transceiver, in which case it will also include an antenna 140. In context of wireless RF systems, antenna is a device that serves as an interface between radio waves propagating wirelessly through space and electric currents moving in metal conductors used in a transmitter, a receiver, or a transceiver. During transmission, a transmitter circuit of an RF transceiver may supply an electric signal, which signal is amplified by a PA, and an amplified version of the signal is provided to antenna's terminals. The antenna may then radiate the energy from the signal output by the PA as radio waves. Antennas are essential components of all radio equipment, and are used in radio broadcasting, broadcast television, two-way radio, communications receivers, radar, cell phones, satellite communications and other devices.

An antenna with a single antenna element will typically broadcast a radiation pattern that radiates equally in all directions in a spherical wavefront. Phased antenna arrays generally refer to a collection of antenna elements that are used to focus electromagnetic energy in a particular direction, thereby creating a main beam, a process commonly referred to as "beamforming." Phased antenna arrays offer numerous advantages over single antenna systems, such as high gain, ability to perform directional steering, and simultaneous communication. Therefore, phased antenna arrays are being used more frequently in a myriad of different applications, such as mobile/cellular wireless technology, military applications, airplane radar, automotive radar, industrial radar, and Wi-Fi technology.

In the embodiments where the RF transceiver 100 is a wireless RF transceiver, the amplified RF signal 131 $y$ can be provided to the antenna 140, which may be implemented as an antenna array that includes a plurality of antenna elements, e.g., N antenna elements. The antenna 140 is configured to wirelessly transmit the amplified RF signal 131 $y$.

In the embodiments where the RF transceiver 100 is a wireless RF transceiver of a phased antenna array system, the RF transceiver 100 may further include a beamformer arrangement, configured to vary the input signals provided to the individual PAs of the PA array 130 to steer the beam generated by the antenna array 140. Such a beamformer arrangement is not specifically shown in FIG. 1 because it may be implemented in different manners, e.g., as an analog beamformer (i.e., where the input signals to be amplifier by the PA array 130 are modified in the analog domain, i.e., after these signals have been converted from the digital domain to the analog domain), as a digital beamformer (i.e., where the input signals to be amplifier by the PA array 130 are modified in the digital domain, i.e., before these signals are converted from the digital domain to the analog domain), or as a hybrid beamformer (i.e., where the input signals to be amplifier by the PA array 130 are modified partially in the digital domain and partially in the analog domain).

Ideally, the amplified RF signal 131 $y$ from the PA 130 should just be an upconverted and amplified version of the output of the transmitter circuit 120, e.g., an upconverted, amplifier, and beamformed version of the input signal 102 $x$. However, as discussed above, the amplified RF signals 131 $y$ can have distortions outside of the main signal components. Such distortions can result from nonlinearities in the response of the PA 130. As discussed above, it can be desirable to reduce such nonlinearities. Accordingly, the RF transceiver 100 may further include a feedback path (or observation path) that allows the RF transceiver to analyze the amplified RF signal 131 $y$ from the PA 130 (in the transmission path). In some embodiments, the feedback path may be realized as shown in FIG. 1A, where a feedback signal 151 $y'$ may be provided from the PA 130 to the receiver circuit 150. However, in other embodiments, the feedback signal may be a signal from a probe antenna element configured to sense wireless RF signals transmitted by the antenna 140 (not specifically shown in FIG. 1A).

Thus, in various embodiments, at least a portion of the output of the PA 130 or the output of the antenna 140 may be provided, as a feedback signal 151, to the receiver circuit 150. The output of the receiver circuit 150 is coupled to the DPD circuit 110, in particular, to the DPD adaptation circuit 114. In this manner, an output signal 151 ($y'$) of the receiver circuit 150, which is a signal based on the feedback signal 151, which, in turn, is indicative of the output signal 131 ($y$) from the PA 130, may be provided to the DPD adaptation circuit 114 by way of the receiver circuit 150. The DPD adaptation circuit 114 may process the received signals and update DPD coefficients c applied by the DPD actuator circuit 112 to the input signal 102 $x$ to generate the actuator output 104 $z$. A signal based on the actuator output z is provided as an input to the PA 130, meaning that the DPD actuator output z may be used to control the operation of the PA 130.

Figure 1C:
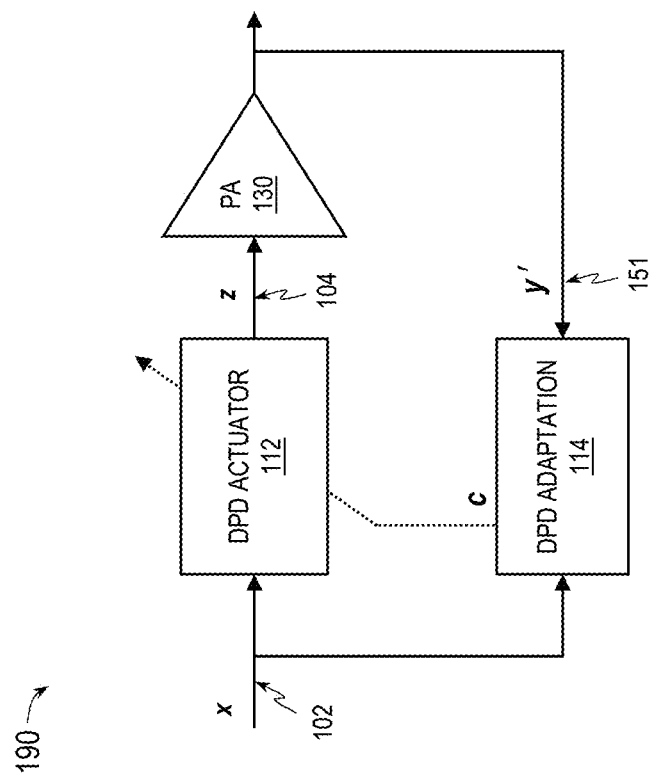
FIG. 1C provides a schematic block diagram of an exemplary direct learning architecture-based DPD in which parameterized model-based configuration may be implemented, according to some embodiments of the present disclosure.
Figure 1B:
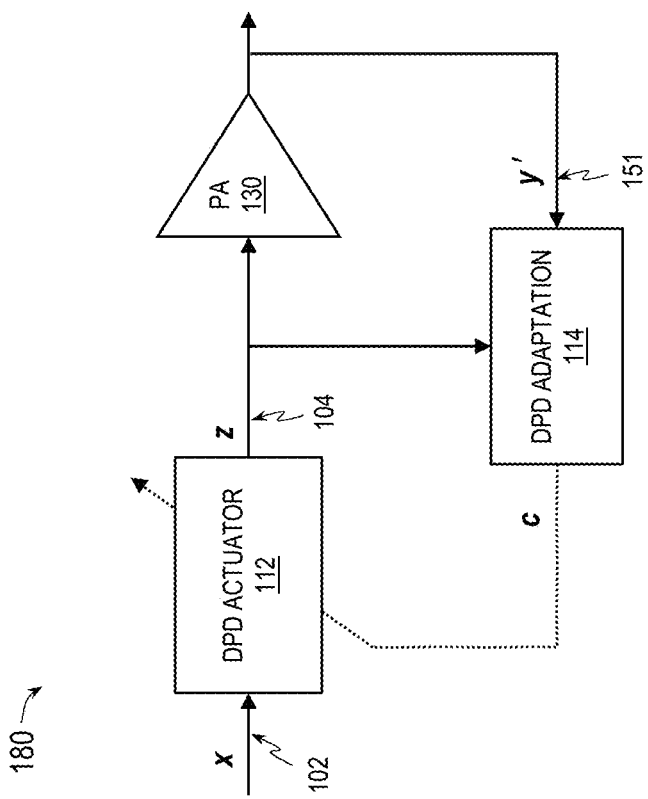
FIG. 1B provides a schematic block diagram of an exemplary indirect learning architecture-based DPD in which parameterized model-based configuration may be implemented, according to some embodiments of the present disclosure.
Figure 2:
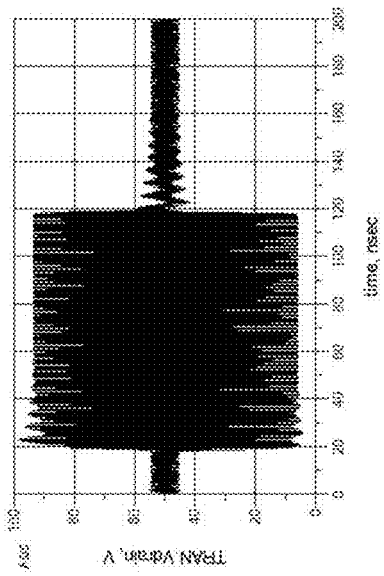
FIG. 2 illustrates exemplary power amplifier (PA) drain inductor resonance effects.

According to aspects of the present disclosure, the DPD circuit 110 may further include an envelope regulator circuit 116. As will be discussed in greater detail below, the envelope regulator circuit 116 may be configured based on a parameterized model 170. The envelope regulator circuit 116 may operate on the input signal 102 $x$ to mitigate the effects of drain inductor resonance at the PA 130 (e.g., as shown in FIG. 2). For instance, the RF transceiver 100 may be part of a macro base station, and the PA 130 may be a high-power PA (e.g., providing an output power greater than about 40 W). The parameterized model 170 may be based on a neural network generated and trained offline by a parameterized model training system 172 (e.g., a computer-implemented system such as the data processing system 2300 shown in FIG. 8) as will be discussed more fully below with reference to FIGS. 2-7. In some aspects, the operations of the DPD actuator circuit 112 and the DPD adaptation circuit 114 may be modeled as part of the training for the parameterized model 170. Further, the DPD actuator circuit 112 and/or the DPD adaptation circuit 114 may be configured to implement DPD using an indirect learning architecture as shown in FIG. 1B or using a direct learning architecture as shown in FIG. 1C.

As further shown in FIG. 1A, in some embodiments, the transmitter circuit 120 may include a digital filter 122, a digital-to-analog converter (DAC) 124, an analog filter 126, and a mixer 128. In such a transmitter, the pre-distorted signal 104 $z$ may be filtered in the digital domain by the digital filter 122 to generate a filtered pre-distorted input, a digital signal. The output of the digital filter 122 may then be converted to an analog signal by the DAC 124. The analog signal generated by the DAC 124 may then be filtered by the analog filter 126. The output of the analog filter 126 may then be upconverted to RF by the mixer 128, which may receive a signal from a local oscillator (LO) 162 to translate the filtered analog signal from the analog filter 126 from baseband to RF. Other methods of implementing the transmitter circuit 120 are also possible and within the scope of the present disclosure. For instance, in another implementation (not illustrated in the present drawings) the output of the digital filter 122 can be directly converted to an RF signal by the DAC 124 (e.g., in a direct RF architecture). In such an implementation, the RF signal provided by the DAC 124 can then be filtered by the analog filter 126. Since the DAC 124 would directly synthesize the RF signal in this implementation, the mixer 128 and the local oscillator 162 illustrated in FIG. 1A can be omitted from the transmitter circuit 120 in such embodiments.

As further shown in FIG. 1A, in some embodiments, the receiver circuit 150 may include a digital filter 152, an analog-to-digital converter (ADC) 154, an analog filter 156, and a mixer 158. In such a receiver, the feedback signal 151 may be downconverted to the baseband by the mixer 158, which may receive a signal from a local oscillator (LO) 160 (which may be the same or different from the local oscillator 160) to translate the feedback signal 151 from the RF to the baseband. The output of the mixer 158 may then be filtered by the analog filter 156. The output of the analog filter 156 may then be converted to a digital signal by the ADC 154. The digital signal generated by the ADC 154 may then be filtered in the digital domain by the digital filter 152 to generate a filtered downconverted feedback signal 151 $y'$, which may be a sequence of digital values indicative of the output y of the PA 130, and which may also be modeled as a vector. The feedback signal 151 $y'$ may be provided to the DPD circuit 110. Other methods of implementing the receiver circuit 150 are also possible and within the scope of the present disclosure. For instance, in another implementation (not illustrated in the present drawings) the RF feedback signal 151 $y'$ can be directly converted to a baseband signal by the ADC 154 (e.g., in a direct RF architecture). In such an implementation, the downconverted signal provided by the ADC 154 can then be filtered by the digital filter 152. Since the ADC 154 would directly synthesize the baseband signal in this implementation, the mixer 158 and the local oscillator 160 illustrated in FIG. 1A can be omitted from the receiver circuit 150 in such embodiments.

Further variations are possible to the RF transceiver 100 described above. For example, while upconversion and downconversion is described with respect to the baseband frequency, in other embodiments of the RF transceiver 100, an intermediate frequency (IF) may be used instead. IF may be used in superheterodyne radio receivers, in which a received RF signal is shifted to an IF, before the final detection of the information in the received signal is done. Conversion to an IF may be useful for several reasons. For example, when several stages of filters are used, they can all be set to a fixed frequency, which makes them easier to build and to tune. In some embodiments, the mixers of RF transmitter 120 or the receiver 150 may include several such stages of IF conversion. In another example, although a single path mixer is shown in each of the transmit (TX) path (i.e., the signal path for the signal to be processed by the transmitter 120) and the receive (RX) path (i.e., the signal path for the signal to be processed by the receiver 150) of the RF transceiver 100, in some embodiments, the TX path mixer 128 and the RX path mixer 158 may be implemented as a quadrature upconverter and downconverter, respectively, in which case each of them would include a first mixer and a second mixer. For example, for the RX path mixer 158, the first RX path mixer may be configured for performing downconversion to generate an in-phase (I) downconverted RX signal by mixing the feedback signal 151 and an in-phase component of the local oscillator signal provided by the local oscillator 160. The second RX path mixer may be configured for performing downconversion to generate a quadrature (Q) downconverted RX signal by mixing the feedback signal 151 and a quadrature component of the local oscillator signal provided by the local oscillator 160 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path. In general, the transmitter circuit 120 and the receiver circuit 150 may utilize a zero-IF architecture, a direct conversion RF architecture, a complex-IF architecture, a high (real) IF architecture, or any suitable RF transmitter and/or receiver architecture.

In general, the RF transceiver 100 may be any device/apparatus or system configured to support transmission and reception of signals in the form of electromagnetic waves in the RF range of approximately 3 kHz to 300 GHz. In some embodiments, the RF transceiver 100 may be used for wireless communications, e.g., in a base station (BS) or a user equipment (UE) device of any suitable cellular wireless communications technology, such as Global System for Mobile Communication (GSM), Code Division Multiple Access (CDMA), or LTE. In a further example, the RF transceiver 100 may be used as, or in, e.g., a BS or a UE device of a millimeter-wave wireless technology such as 5G wireless (i.e., high frequency/short wavelength spectrum, e.g., with frequencies in the range between about 20 and 60 GHz, corresponding to wavelengths in the range between about 5 and 15 millimeters). In yet another example, the RF transceiver 100 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF transceiver 100 may be used for wireless communications using Bluetooth technology (e.g., a frequency band from about 2.4 to about 2.485 GHz, corresponding to a wavelength of about 12 cm). In other embodiments, the RF transceiver 100 may be used for transmitting and/or receiving wireless RF signals for purposes other than communication, e.g., in an automotive radar system, or in medical applications such as magneto-resonance imaging (MRI). In still other embodiments, the RF transceiver 100 may be used for cable communications, e.g. in cable television networks.

FIG. 1B provides a schematic block diagram of an exemplary indirect learning architecture-based DPD 180 in which a parameterized model-based configuration may be implemented, according to some embodiments of the present disclosure. In some aspects, the DPD circuit 110 of FIG. 1A may be implemented as shown in FIG. 1B, and the parameterized model training system 172 may train the parameterized model 170 to configure the DPD circuit 110 for indirect learning-based adaptation. For simplicity, the transmitter circuit 120 and the receiver circuit 150 are not shown in FIG. 1B and only elements related to performing DPD are shown.

For indirect learning, the DPD adaptation circuit 114 may use the observed received signal (e.g., the feedback signal 151 $y'$) as a reference to predict PA input samples corresponding to the reference. The function used for predicting the input samples is known as an inverse PA model (to linearize the PA 130). Once the prediction of input samples corresponding to the observed data is good (e.g., when the error between the predicted input samples and the pre-distorted signal 104 $z$ satisfies certain criteria), the estimated inverse PA model is used to pre-distort transmit data (e.g., the input signal 102 $x$) to the PA 130. That is, the DPD adaptation circuit 114 may compute the inverse PA model that is used by the DPD actuator circuit 112 to pre-distort the input signal 102 $x$. To that end, the DPD adaptation circuit 114 may observe or capture N samples of PA input samples (from the pre-distorted signal 104 $z$) and N samples of PA output samples (from the feedback signal 151 $y'$), compute a set of M coefficients, which may be represented by c, corresponding to the inverse PA model, and update the DPD actuator circuit 112 with the coefficients c as shown by the dotted arrow. In some examples, the DPD adaptation circuit 114 may solve for the set of coefficients c using a least square approximation.

FIG. 1C provides a schematic block diagram of an exemplary direct learning architecture-based DPD 190 in which a parameterized model-based configuration may be implemented, according to some embodiments of the present disclosure. In some aspects, the DPD circuit 110 of FIG. 1A may be implemented as shown in FIG. 1C, and the parameterized model training system 172 may train the parameterized model 170 to configure the DPD circuit 110 for direct learning. For simplicity, the transmitter circuit 120 and the receiver circuit 150 are not shown in FIG. 1B and only elements related to performing DPD are shown.

For direct learning, the DPD adaptation circuit 114 may use the input signal 102 $x$ as a reference to minimize the error between the observed received data (e.g., the feedback signal 151 $y'$) and the transmit data (e.g., the input signal 102 $x$). In some examples, the DPD adaptation circuit 114 may use an iterative technique to compute a set of M coefficients, which may be represented by c, used by the DPD actuator circuit 112 to pre-distort the input signal 102 $x$. For instance, the DPD adaptation circuit 114 may compute current coefficients based on previously computed coefficients (in a previous iteration) and currently estimated coefficients. The DPD adaptation circuit 114 may compute the coefficients to minimize an error indicative of a difference between the input signal 102 $x$ and the feedback signal 151 $y'$. The DPD adaptation circuit 114 may update the DPD actuator circuit 112 with the coefficients c as shown by the dotted arrow.

In some aspects, the DPD actuator circuit 112 in the indirect learning-based DPD 180 of FIG. 1B or the direct learning-based DPD 190 of FIG. 1C may implement DPD actuation using a Volterra series or a GMP model (which is a subset of the Volterra series) as shown below:

$$z[n]=\Sigma_{i,j}\Sigma_k c_{ijk} f_k(\|x[n-i]\|)x[n-j], \quad (1)$$

where $z[n]$ represents an $n^{th}$ sample of the pre-distorted signal 104 $z$, $f_k(\bullet)$ represents a $k^{th}$ function of a DPD model (e.g., include a set of M basis functions), $c_{ijk}$ represents the set of DPD coefficients (e.g., for combining the set of M basis functions), $x[n-i]$ and $x[n-j]$ represent samples of the input signal 102 delayed by i and j number of samples, respectively, and $\|x[n-i]\|$ represents the envelope or amplitude of the sample $x[n-i]$. In some instances, the values for sample delays i and j may be dependent on the PA 130's nonlinear characteristic(s) of interest for the pre-distortion, and $x[n-i]$ and $x[n-j]$ may be referred to as i,j cross-memory terms. While equation (1) illustrates that the GMP model is applied to the envelope or amplitude of the input signal 102 $x$, aspects are not limited thereto. In general, the DPD actuator circuit 112 may apply DPD actuation to the input signal 102 $x$ directly or after pre-processing the input signal 102 $x$ according to a pre-processing function represented by P( ), which may be an amplitude function, an amplitude-squared, or any suitable function.

In some aspects, the DPD actuator circuit 112 may implement equation (1) using one or more lookup tables (LUTs). For example, the terms $\Sigma_k c_{ijk} f_k(\|x[n-i]\|)$ may be stored in a LUT, where the LUT for the i,j cross-memory terms may be represented by:

$$L_{i,j}(\|x[n-i]\|) = \Sigma_k c_{ijk} f_k(\|x[n-i]\|). \quad (2)$$

Accordingly, the operations of the DPD actuator circuit 112 may include selecting first memory terms (e.g., x[n−i] and x[n−j]) from an input signal 102 x and generating a pre-distorted signal 104 z based on the LUT and the selected first memory terms as will be discussed more fully below with reference to FIGS. 3-5. For DPD adaptation using the direct learning architecture shown in FIG. 1C, the operations of the DPD adaptation circuit 114 may include calculating DPD coefficients (e.g., a set of coefficients $c_k$) based on the selected first memory terms and the set of basis functions $f_k$ and updating the one or more LUTs based on the calculated coefficients. On the other hand, for DPD adaptation using the indirect learning architecture shown in FIG. 1B, the operations of the DPD adaptation circuit 114 may include selecting second memory terms (e.g., y'[n−i] and y'[n−j]) from a feedback signal 151 y', calculating DPD coefficients (e.g., a set of coefficients $c_k$) based on the selected second memory terms and the set of basis functions $f_k$ and updating the one or more LUTs based on the calculated coefficients. As such, the DPD circuit 110 may include various circuits such as memory to store LUTs for various cross-memory terms, multiplexers for memory term selections, multipliers, adders, and various other digital circuits and/or processor(s) for executing instructions to perform DPD operations (e.g., actuation and adaptation).

According to aspects of the present disclosure, the parameterized model training system 172 may train the parameterized model 170 to configure at least the envelop regulator circuit 116 to mitigate the effects drain inductor resonance at the PA 130. For instance, the RF apparatus 100 may be part of a macro base station, and the PA 130 may be a high-power PA. In some aspects, the parameterized model training system 172 may model the operations of the DPD actuator circuit 112 and the DPD adaptation circuit 114 as part of training the parameterized model 170. Mechanisms for training the parameterized model 170 (e.g., during offline) and operating the DPD circuit 110 (e.g., during online) according to the trained parameterized model 170 will be discussed more fully below with reference to FIGS. 2-7. For simplicity, FIGS. 2-7 are discussed using the same signal representations as in FIGS. 1A-1C. For example, the symbol x may refer to an input signal to a DPD actuator circuit that linearizes a PA, the symbol z may refer to an output signal (pre-distorted signal) provided by a DPD, the symbol y may refer to an output of the PA, the symbol y' may refer to an observed received signal indicative of an output of the PA, and the symbol c may refer to DPD coefficients for combining basis functions associated with features or nonlinearities of a PA. Further, the input signal 102 x and the pre-distorted signal 104 z can be referred to as transmission data (TX), and the feedback signal 151 y' can be referred to as observation data (ORx).

Example PA Drain Inductor Resonance Effects

FIG. 2 illustrates exemplary PA drain inductor resonance effects, for example, at a PA (e.g., the PA 130) with a high output power (e.g., >40 W). FIG. 2 shows the transient simulation result of a single transistor PA (the PA 300 of FIG. 3) with a drain inductor resonance behavior, where the graph 210 shows the input signal waveform (e.g., over a wide instantaneous BW of about 280 MHz) to the PA and the graph 220 shows the output signal waveform (e.g., an RF signal waveform) of the PA. As shown by the graphs 210 and 220, the envelope of the drain voltage oscillates and distorts the output RF waveform. Depending on the sizes of multiple decoupling capacitors, the duration and frequency of this resonance may vary. In some instances, this is concerning for macro-PAs rather than massive multiple-input, multiple output (MIMO) PAs due to more complex decoupling capacitor networks and a higher drain current change rate (e.g., represented as dI/dt).

Figure 3:
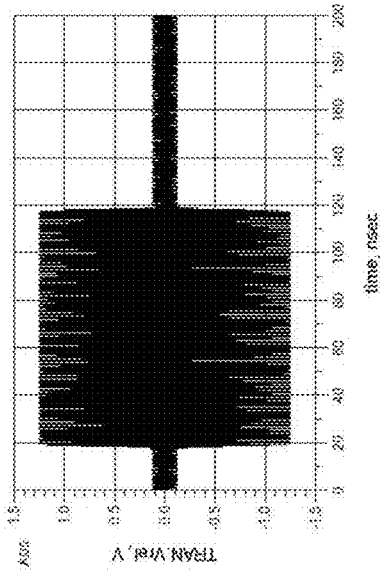
FIG. 3 provides a schematic diagram illustrating an exemplary high-power PA in which drain inductor resonance may occur.
Figure 3:
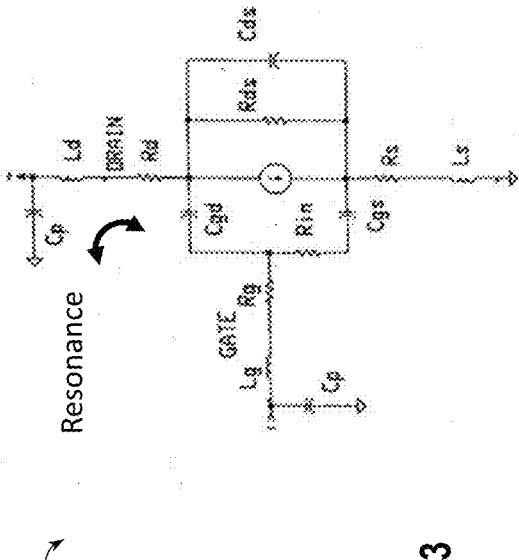

FIG. 3 provides a schematic diagram illustrating an exemplary high-power PA 300 (e.g., the PA 130), for example, which may be a macro base station PA providing an output power greater than about 40 W. The input signal at the gate may be a wide BW signal with a high slew rate (e.g., with instantaneous signal rise and instantaneous signal fall). Because of the large output power, the supply that feeds the drain may start to resonate, which may in turn inject modulated long-term waveforms at the output, causing the ringing or oscillation effects shown in the graph 220 of FIG. 2.

To address the PA drain inductor resonance issue with digital assistance, baseband equivalent analysis shows oscillation in baseband complex gain when the drain voltage resonates. This can be seen as a step response with a memory depth over the duration of the resonance. In an example, for a 40 W PA, the memory effect may last for ~4-6 us, which is far beyond the typical range handled by a DPD used by 5G transceivers.

Example Envelope Regulated, DPD

Figure 4:
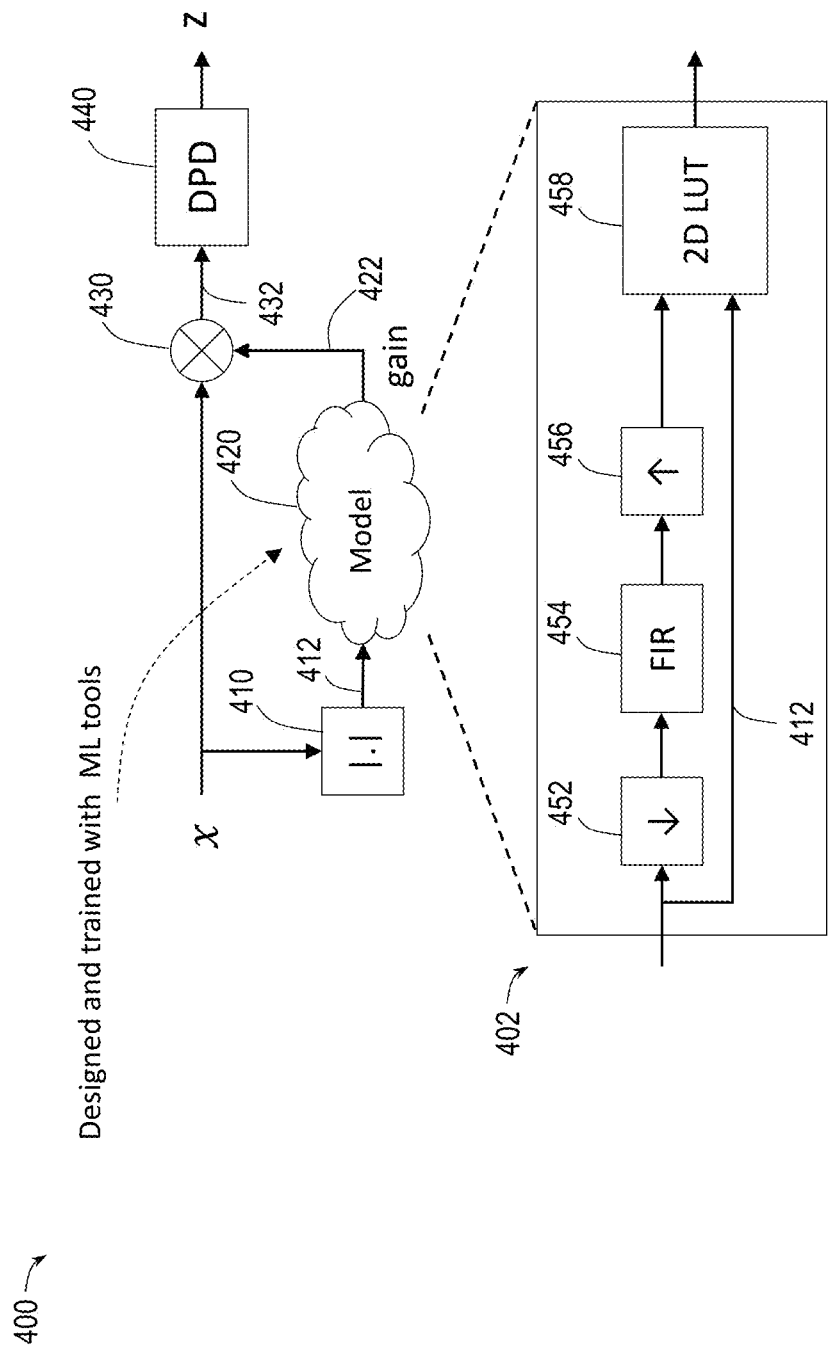
FIG. 4 provides a block diagram illustrating an exemplary neural-network-assisted physical model for precompensating PA gain oscillations, according to embodiments of the present disclosure.

FIG. 4 provides a block diagram illustrating an exemplary neural-network-assisted physical model 400 for precompensating PA gain oscillations, according to embodiments of the present disclosure.

To mitigate the impact from the drain voltage resonance with DPD, the gain oscillation may be first modeled. With the envelope-induced gain oscillation model, the waveform then can be predistorted by applying the inverse gain using the model 420 prior to the DPD 440 (e.g., the DPD actuator circuit 112). The DPD 440 may be a sample-rate DPD operating at the sampling rate of the input signal x (e.g., the input signal x 102).

The challenge is to first model the drain inductor resonance behavior accurately, followed by modeling the gain oscillation due to drain inductor resonance. Due to the complexity of the PA, it may be difficult to derive a full compact model based on device physics. According to aspects of the present disclosure, the modeling of the PA drain inductor resonance behavior can leverage machine learning capability that enables data-driven modeling with blackbox neural networks. In an aspect, an FIR filter 454 may be used to represent the impulse response of the PA drain bias feed; and then since the PA baseband gain is a function of the drain voltage and the waveform envelope (e.g., gain_IQ=F(ΔV_DD, |x|), where gain_IQ represents the gain of the IQ signal, ΔV_DD represents the PA drain voltage variation, and |x| represents the amplitude or envelope of the input signal x), a two-input, two-output multi-layer perceptron (MLP) (a neural network) can be used to numerically approximate this mapping (e.g., as shown in FIG. 5). In an example, the MLP model may include 3 hidden layers with (16, 32, 16) neurons respectively. In general, the MLP model may include any suitable number of hidden layers and each can include any suitable number of neurons. Combining these two components together, the full model is shown by 402. Additional downsampling 452 and/or upsampling 456 can be included to adjust the Nyquist frequency of the FIR filter 454 based on the resonance frequency. The MLP model may output a two-dimensional (2D) LUT 458 representing (envelope, $V_{DS}$) to gain mapping. In some instances, the 2D LUT 458 may be referred to as a voltage variation and signal envelope to gain mapping table. In an aspect, since the MLP model has 2 inputs and 2 outputs, the conversion from the neural network to the 2D LUT 458 can be done by running a quantized mesh grid through the neural network and use the outputs as the LUT 458 contents.

In an aspect, an envelope (or amplitude) of the input signal x (e.g., the input signal x 102) may be computed by the block 410, the model 420 may operate on the envelope of the input signal x (shown by 412) to precompensate or mitigate the PA drain inductor resonance effects. The model 420 may output a gain regulation or gain inversion signal 422. The multiplier 430 may multiply the input signal x with the gain inversion signal 422 to provide a gain-precompensated signal 432 and provide the gain-precompensated signal 432 to the DPD 440.

In an aspect, the model 420 may be designed and trained using machine learning tools. For instance, the model 420 may correspond to the parameterized model 170 and may be trained by the parameterized model training system 172.

In an aspect, the operations shown by 402 may be implemented by the RF transceiver 100 of FIG. 1A. Referring to FIG. 1A, the envelope regulator circuit 116 may implement the operations shown by 402. The envelope regulator circuit 116 may process an envelope of an input signal 102 (to be transmitted by the PA 130) based on a parameterized model to generate an envelope regulated signal (e.g., a gain oscillation precompensated signal). The DPD actuator circuit 112 may process the envelope regulated signal and the input signal based on DPD coefficients associated with a nonlinear characteristic of the nonlinear component. The DPD adaptation circuit 114 may update the DPD coefficients based on a feedback signal indicative of an output of the nonlinear component.

In some aspects, the RF transceiver 100 may further include a control block (e.g., hardware registers) to configure a gain regulation model associated with the drain inductor resonance of the PA 130, and the envelope regulator circuit 116 may process the envelope of the input signal 102 based on the gain regulation model. In some aspects, the gain regulation model may include a drain voltage-to-gain mapping lookup table (LUT) based on the parameterized model. For instance, the drain voltage-to-gain mapping LUT (e.g., the 2D LUT 458) may be generated based on the parameterized model.

In some aspects, the drain bias feed for the PA 130 may be modeled by an FIR. Accordingly, the envelope regulator circuit 116 may further include a filter (e.g., an FIR filter 454) upstream of the gain regulation model (e.g., the drain voltage-to-gain mapping LUT), the control block may further configure a filter based on the parameterized model, and the envelope regulator circuit 116 may process the envelope of the input signal 102 further based on the filter. In some aspects, the DPD actuator circuit 112 may operate at a sampling rate at which the input signal 102 is sampled while the filter may operate at a lower sampling rate than the input signal sampling rate (e.g., at a decimated sampling rate). In this regard, the envelope regulator circuit 116 may further include a downsampler (e.g., the downsampler 452) upstream of the filter and an upsampler (e.g., the upsampler 456) downstream of the filter arranged in a similar way as shown in FIG. 4, and the control block may further configure the downsampler and the upsampler based on the parameterized model.

In some aspects of the RF transceiver 100 of FIG. 1A, the envelope regulator circuit 116 may include a first path (a signal path) and a second path (a signal path), where the second path may be arranged in parallel with the first path. Each of the first and second paths may implement the operations shown by 402. In this regard, the first path may include a first downsampler (e.g., the downsampler 452) upstream of a first filter (e.g., an FIR filter 454), a first upsampler (e.g., the upsampler 456) downstream of the first filter, and a first mapping table (e.g., a first voltage variation and signal envelope to gain mapping table similar to the 2D LUT 458) arranged as shown in FIG. 4. Similarly, the second path may include a second downsampler (e.g., the downsampler 452) upstream of a second filter (e.g., an FIR filter 454), a second upsampler (e.g., the upsampler 456) downstream of the second upsampler, and a second mapping table (e.g., a second voltage variation and signal envelope to gain mapping table similar to the 2D LUT 458) arranged as shown in FIG. 4. In some instances, the first mapping table may be different from the second mapping table. Additionally or alternatively, the first downsampler and the second downsampler may be based on different downsampling factors. Additionally or alternatively, the first upsampler and the second upsampler may be based on different upsampling factors. Additionally or alternatively, the first filter and the second filter may be different filters (having different filter coefficients).

Stated differently, in some aspects, an input signal 102 (to be transmitted by the PA 130) can be processed by two or more separate paths (the first path and the second path) for envelope regulation as discussed herein, where each path can perform envelope regulation using different sampling factors, different filters, and/or different mapping tables. More specifically, in the first path, the envelope of the first input signal 102 may be processed by first downsample, the first filter, and the first upsampler to provide a first processed signal envelope (e.g., modeling gain variations). Further, the first processed signal envelope and the input signal 102 envelope may be mapped to gain values using the first mapping table. In a similar way, in the second path, the envelope of the first input signal 102 may be processed by second downsample, the second filter, and the second upsampler to provide a second processed signal envelope (e.g., modeling gain variations). Further, the second processed signal envelope and the input signal 102 envelope may be mapped to gain values using the second mapping table Subsequently, the envelope regulated signals from each of the paths can be combined and processed by the DPD actuator circuit 112 for predistortion and/or by DPD adaptation circuit 114 for updating DPD coefficients as discussed above with reference to FIGS. 1A-1C.

Learning Model Parameters from Data

To learn the FIR coefficients and the NN-based gain mapping, the model 400 of FIG. 4 may be implemented using differentiable operations. With auto differentiation, these unknown parameters can be optimized end-to-end with a single capture from the PA test bench using gradient descent and backpropagation. As an example, transmit (TX) signals (e.g., the input signal x 102) can be input to a high-power PA and outputs of the high-power PA can be observed and captured, for example, as observed signals (ORx) (e.g., the signal y' 151). In an example, training in an inverse mode (i.e., from ORx to TX) can be performed with Adam optimizer with different learning rates for the FIR coefficients and the MLP.

Figure 5:
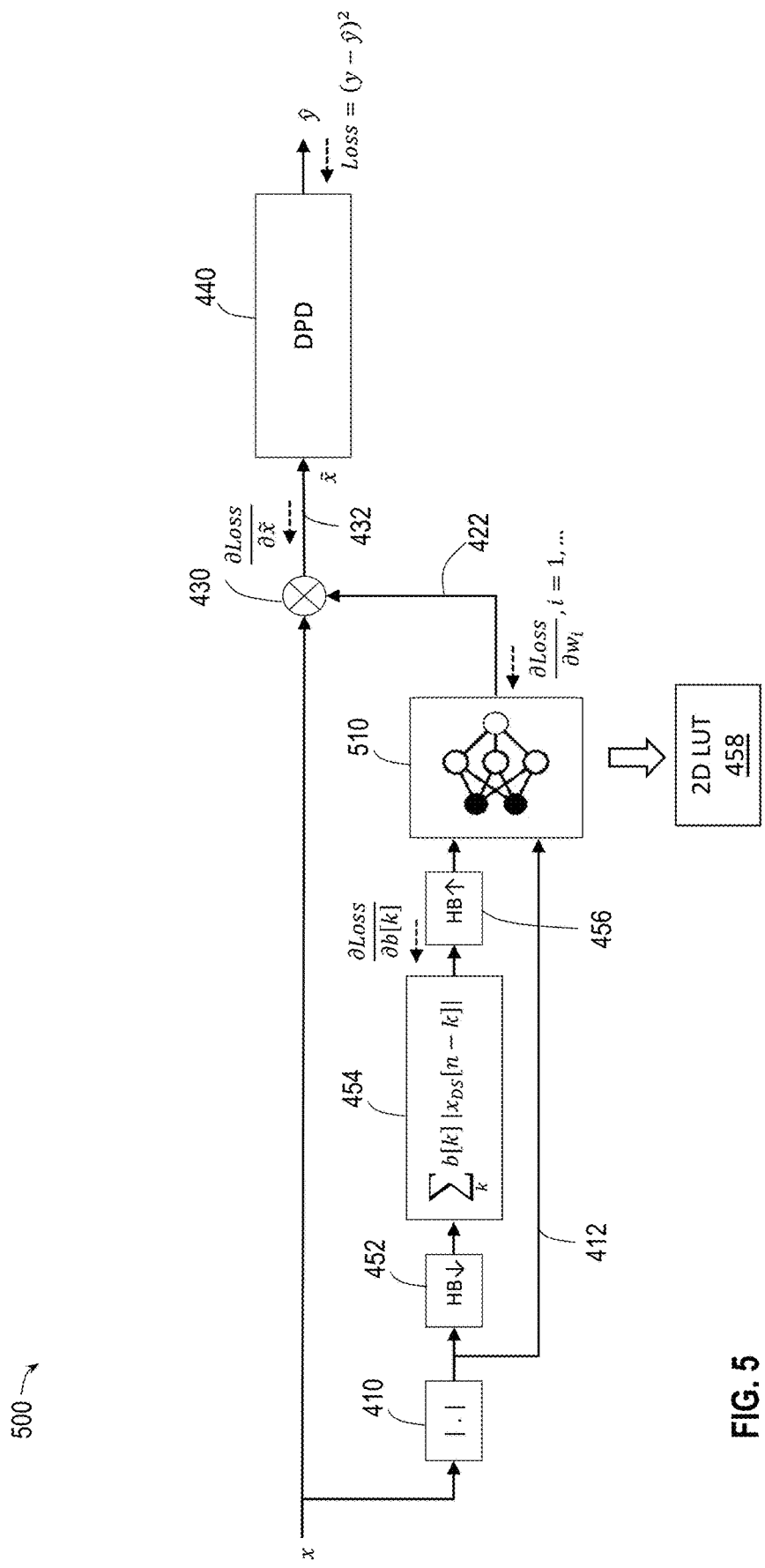
FIG. 5 provides a block diagram illustrating an exemplary neural-network-assisted envelope regulated, DPD model with mid-term memory envelope features, according to embodiments of the present disclosure.

FIG. 5 provides a block diagram illustrating an exemplary neural-network-assisted envelope regulated, DPD model 500 with mid-term memory envelope features, according to embodiments of the present disclosure. The model 500 provides a more detailed view of the model 400. For simplicity, FIG. 5 may use the same reference numerals as in FIG. 4 to refer to the same elements of FIG. 4.

In an aspect, the downsampler 452 and the upsampler 456 may be implemented as half-band (HB) filter decimator and interpolator, respectively. In an aspect, the FIR filter 454 is represented by:

$$\Sigma_k b[k] |x_{DS}[n-k]|, \quad (3)$$

where b[k] represents the FIR coefficients and $x_{DS}$ represents the downsampled input signal (the input signal x downsampled by the downsampler 452, and $|x_{DS}[n-k]|$ represents the envelope of the downsampled input signal. In some aspects, the downsampler 452 and the upsampler 456 can be configured with any suitable downsampling and upsampling factor, for example, to reduce the size (e.g., number of taps) of the FIR filter 454. In an example, the FIR filter 454 may have 64 taps, and the choice of up/downsampling factor can be 1×/2×/4×. The DPD 440 can run at the sampling rate of the input signal x. For instance, the model 500 can include multiple paths (e.g., each including a block 410, a downsampler 452, a filter 454, an upsampler, and a neural network 510 arranged as shown in FIG. 5) with different upsampling/downsampling factors as discussed above.

In an aspect, a 2-input (env, VDS), 2-output (gain I/Q) neural network 510 may be used to numerically fit gain mapping for the 2D LUT 458. Once b[k] and the 2D LUT 458 are learned, coefficients of the DPD 440 (e.g., c_ijk) can be adapted with a least square (LS) adaptation using autocorrelation and cross-correlation matrices built with envelope features.

In an aspect, a single TX-ORX signal pair (e.g., test data set) on widest BW at full power waveforms may be captured from a target hardware (e.g., using open loop or closed loop).

In an aspect, optimization tool(s) for ML framework can be used to perform automatic differentiation to backpropagate modeling error (through LS fitted DPD model) to compute gradients on learnable parameters (e.g., NN weights and FIR coefficients). The backpropagation and corresponding automatic differentiation for each block in FIG. 5 are shown by the dotted arrows.

In an aspect, stochastic gradient descent (SGD)-based optimized may be used to perform mini-batch updates over captured data sets.

In an aspect, the 2D LUT 458 of may have about 256 entries, and a total of 4 LUTs to achieve interpolation in a single clock cycle.

In some aspects, each of the block 410 (for signal envelope calculation), the downsampler 452, the filter 454, the upsampler 456, the neural network 510, and the DPD 440 in the model 500 may be a differentiable functional block and may have a one-to-one correspondence to operations performed at a target hardware (e.g., at least some portions of the DPD circuit 110 in the RF transceiver 100 of FIG. 1A). For instance, the envelope regulator circuit 116 of FIG. 1A may include a signal envelope calculation block, a downsampler, a filter, an upsampler, and a 2D LUT (e.g., corresponding to the neural network 510) arranged in the same way as shown in the model 500, and the envelope regulator circuit 116 may be coupled to the DPD actuator circuit 112 and the DPD adaptation circuit 114 (e.g., the DPD 440 may model both the DPD actuator circuit 112 and the DPD adaptation circuit 114) in the same way as shown in the model 500. To generate a parameterized model 170 (e.g., offline) for configuring the envelope regulator circuit 116 (for online operations), input signal data (shown by x) and a desired signal (shown by y) collected from the target hardware may be used to train the parameterized model 170.

As shown in FIG. 5, the block 410 can calculate a signal envelope (amplitudes) of the input signal x, the downsampler 452, the filter 454, and the upsampler 456 may process the signal envelope, and the processed signal envelope (e.g., representing the drain voltage variation) and the signal envelope can be processed by the neural network 510 to provide an output (a gain inversion signal 422 for envelope regulation). The multiplier 430 may multiply the input signal x with the gain inversion signal 422 to provide a gain-precompensated signal 432 (denoted as x̃). The gain-precompensated signal 432 may be provided to the DPD 440 for predistortion. The processing of the input signal x by the block 410, the downsampler 452, the filter 454, the upsampler 456, the neural network 510, the multiplier 430, and the DPD 440 may be referred to as forward propagation.

To train the model 500, a mean-squared error (MSE) loss function (e.g., Loss=$(y-\hat{y})^2$, where $\hat{y}$ may represent the predistorted signal output by the DPD 440) may be computed. For direct learning DPD, y may represent the difference between the input signal x and an observed signal (e.g., a feedback signal indicative of an output of the PA 130). For indirect learning DPD, y may represent the desired signal (e.g., an ideal transmission signal). A backpropagation (shown by the dashed arrows) may be performed to adjust the parameters for the downsampler 452, the filter 454, the upsampler 456, the neural network 510, and/or the DPD 440. As shown further shown in FIG. 5, as part of the back propagation, a gradient of the loss function with respect to the gain-precompensated signal 432 (e.g., $$\frac{\partial \text{Loss}}{\partial \tilde{x}}\Big),$$

a gradient of the loss function with respect to the weights of the neural network 510 (e.g., $$\frac{\partial \text{Loss}}{\partial w_i},$$

where $w_i$ represents i-th weight), and a gradient of the loss function with respect to the filter 454 coefficients (e.g., $$\frac{\partial \text{Loss}}{\partial b[k]},$$

where b[k] represents the k-th coefficient) may be computed. In some aspects, the forward propagation computations and the backpropagation computations may be repeated until the MSE loss function satisfies a certain threshold.

In some aspects, a computer-implemented system (e.g., the system 172 of FIG. 1 or the system 2300 of FIG. 10) may implement a method for training a parameterized model (e.g., the parameterized model 170) to provide envelope regulation so that the PA gain oscillation caused by the PA drain inductor resonance can be mitigated. The computer-implemented system may receive a data set including one or more data pairs, each including an input signal (e.g., the signal 102) and an observed signal (e.g., the signal 151) associated with a PA (e.g., a high-power PA). For instance, the input signal and the observed signal may be collected from a target hardware. The computer-implemented system may further train the parameterized model based on the data set. As part of training the parameterized model, the computer-implemented system may update at least one parameter of the parameterized model associated with configuring a plurality of processing units associated with an envelope regulator circuit. The method may include outputting, based on the training, one or more configurations for the plurality of processing units associated with the envelope regulator circuit.

In some aspects, the computer-implemented system may generate the parameterized model. As part of generating the parameterized model, the computer-implemented system may generate a mapping between each of the plurality of processing units associated with the envelope regulator circuit to one of a plurality of differentiable functional blocks.

In some aspects, the envelope regulation for the nonlinear component may include a sequence of operations, where the computer-implemented system may further calculate a parameter for each operation in the sequence of operations. In some aspects, the calculating the parameter for each operation in the sequence of operations is further based on a backpropagation process and a loss function, for example, as discussed above with reference to FIG. 5. In some aspects, the sequence of operations of the envelope regulation for the nonlinear component may include at least one of a downsampling operation, a filtering operation, an upsampling operation, or a PA drain voltage-to-gain mapping operation, for example, as discussed above with reference to FIGS. 4-5.

Learned Model Parameters

Figure 6:
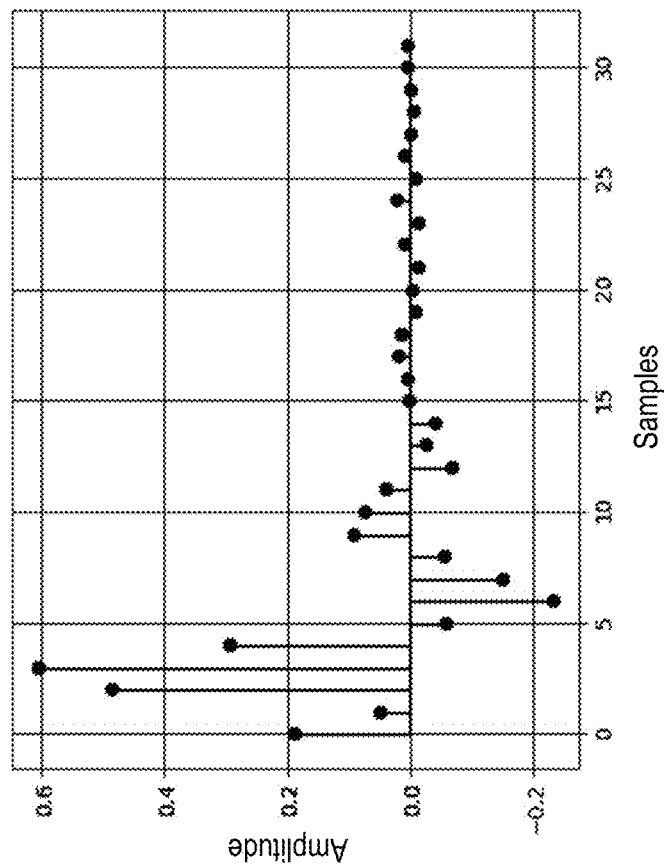
FIG. 6 illustrates a finite impulse response (FIR) impulse response plot representing a PA drain bias feed, according to some aspects of the present disclosure.

FIG. 6 illustrates an FIR impulse response plot 600 representing a PA drain bias feed, according to some aspects of the present disclosure. In FIG. 6, the x-axis represents sample index, and the y-axis represents amplitude in any suitable units. The FIR impulse response shown in the plot 600 may be learnt using mechanisms as discussed above with reference to FIG. 5. The plot 600 is the baseband equivalent resonance behavior of the drain inductor (e.g., at a PA arrangement as shown in FIG. 3).

Figures 7A, 7B:
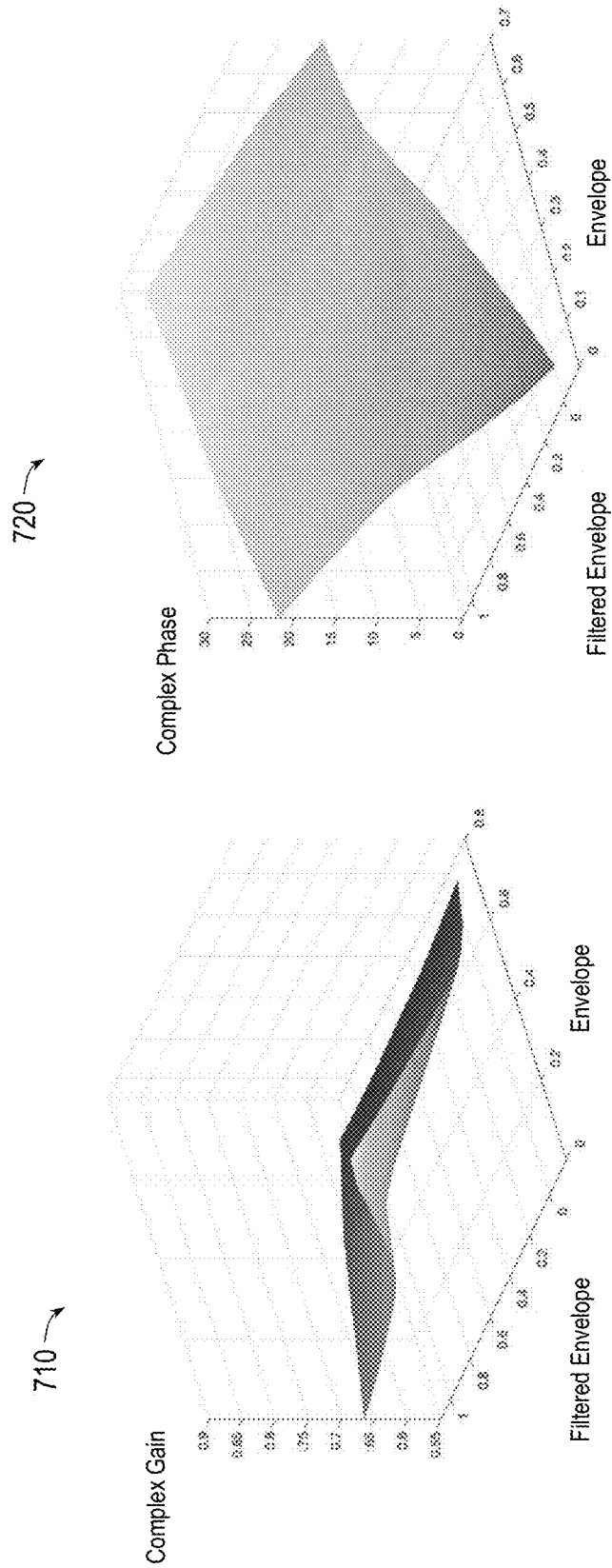
FIGS. 7A-7B illustrates a magnitude plot and a phase plot for a two-dimensional (2D) lookup table (LUT), respectively, according to some aspects of the present disclosure.

FIG. 7A-7B illustrate a magnitude plot 710 and a phase plot 720, respectively, for a 2D LUT (e.g., the 2D LUT 458) generated based on the neural network 510 of FIG. 5, according to some aspects of the present disclosure. The neural network 510 may be learnt using mechanisms as discussed above with reference to FIG. 5. The plot 710 illustrates an example learned gain mapping from drain voltage (filtered envelope) and waveform envelope to complex gain. The plot 720 illustrates an example learned gain mapping from drain voltage (filtered envelope) and waveform envelope to complex phase. Unlike the mainstream blackbox large neural network models, the learned components of the physically-based model becomes meaningful and interpretable, even if learned with data-driven approach. This is possible when the model agrees well with the underlying physics, so the learned parameters would be those physically meaningful ones.

Example Parametrized Model-Based Envelope Regulation Methods

Figure 8:
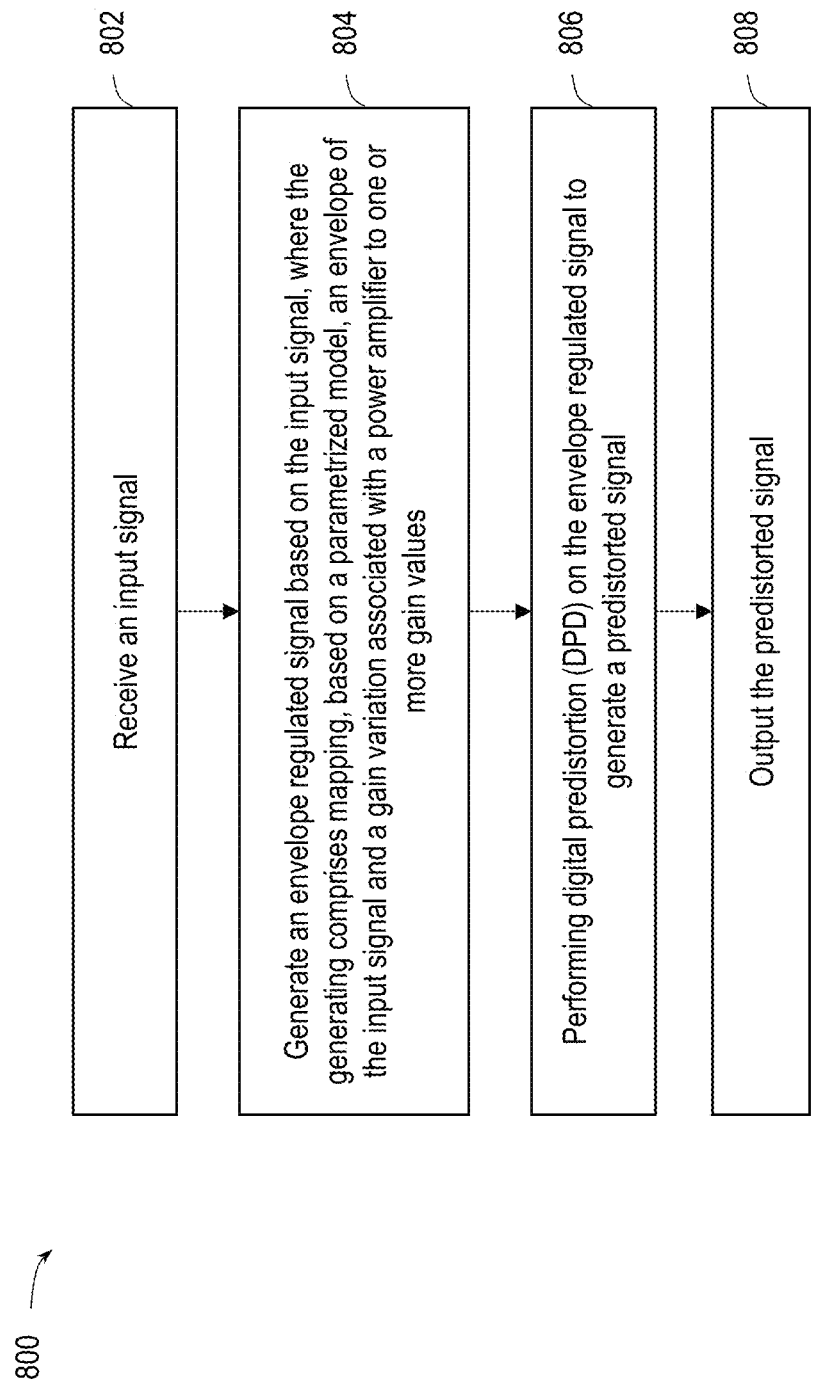
FIG. 8 provides a flow diagram illustrating an exemplary method for performing DPD in conjunction with parameterized model-based envelope regulation on a target hardware, according to some embodiments of the present disclosure.

FIG. 8 provides a flow diagram illustrating an exemplary method 800 for performing DPD in conjunction with parameterized model-based envelope regulation on a target hardware, according to some embodiments of the present disclosure. In some aspects, the method 800 may be implemented by a DPD apparatus (e.g., the DPD circuit 110, the indirect learning DPD 180, and/or the direct learning DPD 190) for which the parameterized model is trained. In some aspects, the method 800 may be implemented as part of the envelope regulation and DPD as discussed above. Operations are illustrated once each and in a particular order in FIG. 8, but the operations may be performed in parallel, reordered, and/or repeated as desired At 802, a digital input signal may be received.

At 804, an envelope regulated signal may be generated based on the digital input signal, for example, using the envelope regulator circuit 116 of FIG. 1A. The generating the envelope regulated signal may include mapping an envelope of the input signal and a gain variation associated with a power amplifier (e.g., the PA 130) to one or more gain values based on a parameterized model (e.g., the parameterized model 170). In some aspects, the mapping the envelope of the input signal and the gain variation associated with the power amplifier to the one or more gain values may include filtering the input signal using a filter (e.g., the filter 454) to generate a filtered signal, where coefficients of the filter may be based on the parametrized model. The mapping may further include determining the one or more gain values from a two-dimensional lookup table (e.g., the LUT 458 generated from the neural network 510) based on an envelope (e.g., instantaneous envelope) of the filtered signal and an envelope (e.g., instantaneous envelope) of the input signal. In some aspects, a response (e.g., an impulse response) of the filter may be associated with the envelope of the input signal and the gain variation associated with the power amplifier. In some aspects, the mapping the envelope of the input signal and the gain variation associated with the power amplifier to the one or more gain values may include downsampling the input signal (e.g., using the downsampler 452) before the filtering and upsampling the filtered signal (e.g., using the upsampler 456) before determining the one or more gain values. In some aspects, the generating the envelope regulated signal may further include multiplying the input signal with the one or more gain values (e.g., using the multiplier 430).

At 806, digital predistortion (DPD) may be performed on the envelope regulated signal to generate a predistorted signal (e.g., using the DPD actuator circuit 112).

At 808, the predistorted signal may be output, for example, to be transmitted by a nonlinear component (e.g., the PA 130).

Figure 9:
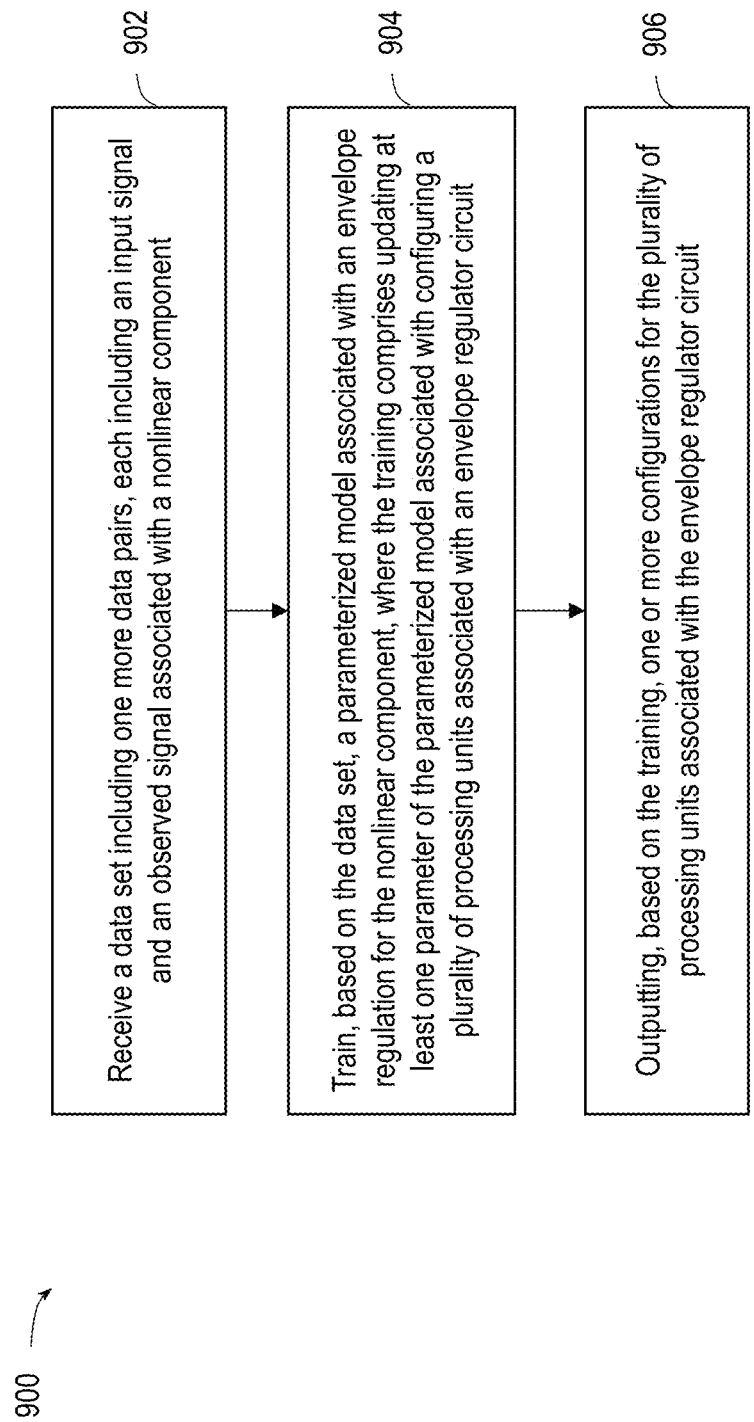
FIG. 9 provides a flow diagram illustrating an exemplary method for training a parameterized model for envelope regulation, which may be used in conjunction with DPD operations, according to some embodiments of the present disclosure.

FIG. 9 provides a flow diagram illustrating an exemplary method 900 for training a parameterized model (e.g., the parameterized model 170) for envelope regulation, which may be used in conjunction with DPD operation, according to some embodiments of the present disclosure. The method 900 may be implemented by a computer-implemented system (e.g., the parameterized model training system 172 of FIG. 1A and/or the data processing system 2300 shown in FIG. 10). In some aspects, the method 900 may be implemented as part of the offline training shown in FIGS. 4 and 5. Operations are illustrated once each and in a particular order in FIG. 9, but the operations may be performed in parallel, reordered, and/or repeated as desired.

At 902, a data set including one more data pairs may be received. Each data pair may include an input signal and an observed signal associated with a nonlinear component (e.g., the PA 130).

At 904, a parameterized model (e.g., the parameterized model 170) associated with an envelope regulation (e.g., the operations 402) for the nonlinear component may be trained based on the data set. The training may include updating at least one parameter of the parameterized model associated with configuring a plurality of processing units associated with an envelope regulator circuit (e.g., the envelope regulator circuit 116).

At 906, one or more configurations for the plurality of processing units associated with the envelope regulator circuit may be output based on the training.

In some aspects, the method 900 may further include generating the parameterized model, where the generating may include generating a mapping between each of the plurality of processing units associated with the envelope regulator circuit and one of a plurality of differentiable functional blocks.

In some aspects, the envelope regulation for the nonlinear component may include a sequence of operations, and the method 900 may further include calculating a parameter for each operation in the sequence of operations. In some aspects, the calculating the parameter for each operation in the sequence of operations may be performed further based on a backpropagation process and a loss function. In some aspects, the sequence of operations of the envelope regulation for the nonlinear component may include a power amplifier voltage variation and an input signal envelope to gain mapping operation (e.g., processing by the neural network 510 or mapping by the LUT 458). In some aspects, the sequence of operations of the envelope regulation for the nonlinear component may include a filtering operation (e.g., processing by the filter 454). In some aspects, the sequence of operations of the envelope regulation for the nonlinear component may include a downsampling operation (e.g., processing by the downsampler 452) and an upsampling operation (e.g., processing by the upsampler 456).

In some aspects, the outputting the one or more configurations at 906 may include outputting information associated with a two-dimensional lookup table (e.g., the LUT 458) that maps voltage gain variations and input signal envelope associated with the nonlinear component to gain values. In some aspects, the outputting the one or more configurations at 906 may include outputting information (e.g., filter coefficients b[k] as discussed above) associated with a filter that models a voltage variation of the nonlinear component based on an input signal envelope.

Example Data Processing System

Figure 10:
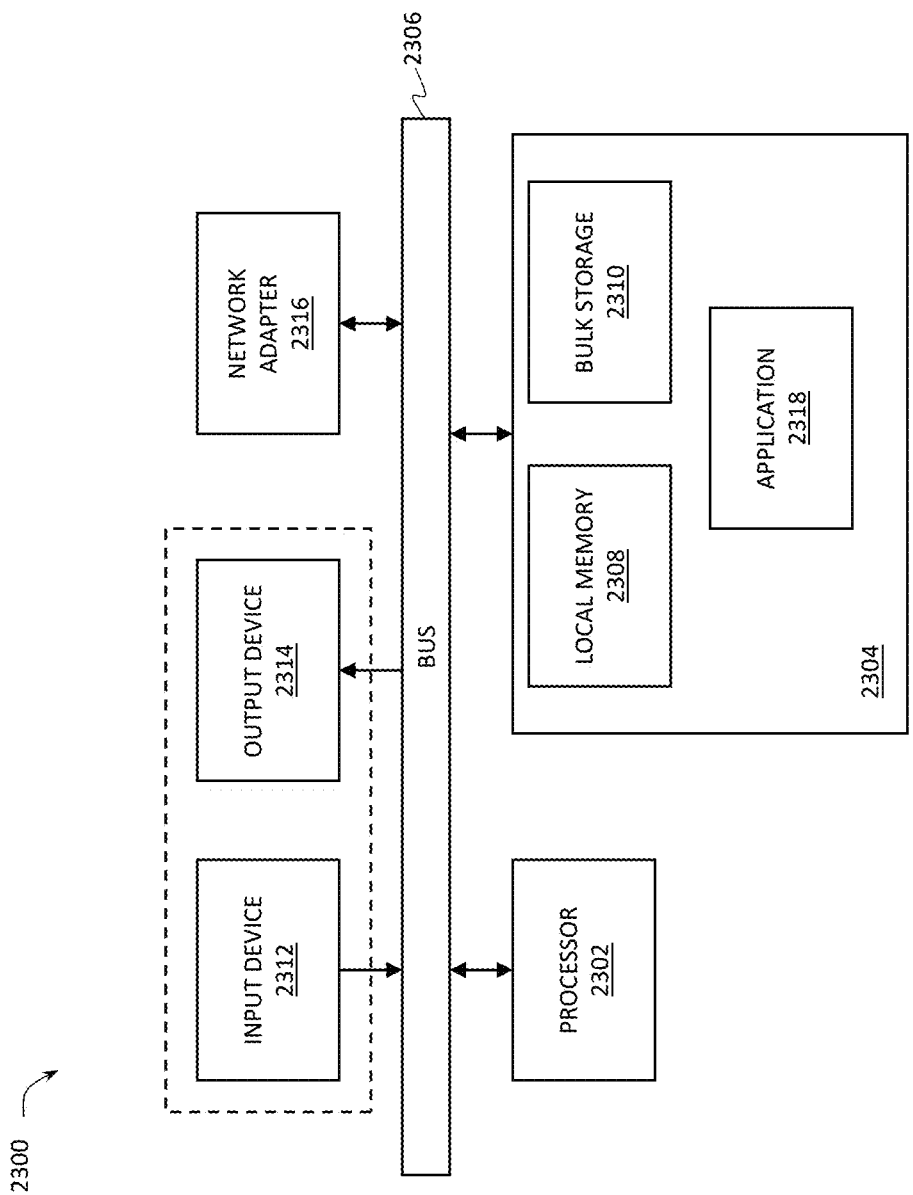
FIG. 10 provides a block diagram illustrating an exemplary data processing system that may be configured to implement, or control, at least portions of hardware block configuration using neural networks, according to some embodiments of the present disclosure.

FIG. 10 provides a block diagram illustrating an exemplary data processing system 2300 that may be configured to implement, or control, at least portions of hardware block configuration using neural networks, according to some embodiments of the present disclosure. In an example, the data processing system 2300 may be configured to train a parameterized model (e.g., the parameterized model 170) for configuring a target hardware using model architecture search techniques (e.g., DNAS) as discussed herein. In another example, the data processing system 2300 may be configured to configure a DPD hardware based on configurations provided by a trained parameterized model as discussed herein.

As shown in FIG. 10, the data processing system 2300 may include at least one processor 2302, e.g., a hardware processor 2302, coupled to memory elements 2304 through a system bus 2306. As such, the data processing system may store program code within memory elements 2304. Further, the processor 2302 may execute the program code accessed from the memory elements 2304 via a system bus 2306. In one aspect, the data processing system may be implemented as a computer that is suitable for storing and/or executing program code. It should be appreciated, however, that the data processing system 2300 may be implemented in the form of any system including a processor and a memory that is capable of performing the functions described within this disclosure.

In some embodiments, the processor 2302 can execute software or an algorithm to perform the activities as discussed in the present disclosure, in particular activities related to performing DPD with neural-network-assisted envelope regulation as described herein. The processor 2302 may include any combination of hardware, software, or firmware providing programmable logic, including by way of non-limiting example a microprocessor, a digital signal processor (DSP), a field-programmable gate array (FPGA), a programmable logic array (PLA), an application specific integrated circuit (IC) (ASIC), or a virtual machine processor. The processor 2302 may be communicatively coupled to the memory element 2304, for example in a direct-memory access (DMA) configuration, so that the processor 2302 may read from or write to the memory elements 2304.

In general, the memory elements 2304 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 2300 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any elements illustrating DPD arrangements for performing DPD with neural-network-assisted envelope regulation as shown in FIGS. 1A-1C and 4-5, can also include suitable interfaces for receiving, transmitting, and/or otherwise communicating data or information in a network environment so that they can communicate with, e.g., the data processing system 2300.

In certain example implementations, mechanisms for performing DPD with neural-network-assisted envelope regulation as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g., the memory elements 2304 shown in FIG. 10, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g., the processor 2302 shown in FIG. 10, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 2304 may include one or more physical memory devices such as, for example, local memory 2308 and one or more bulk storage devices 2310. The local memory may refer to RAM or other non-persistent memory device(s) generally used during actual execution of the program code. A bulk storage device may be implemented as a hard drive or other persistent data storage device. The processing system 2300 may also include one or more cache memories (not shown) that provide temporary storage of at least some program code in order to reduce the number of times program code must be retrieved from the bulk storage device 2310 during execution.

As shown in FIG. 10, the memory elements 2304 may store an application 2318. In various embodiments, the application 2318 may be stored in the local memory 2308, the one or more bulk storage devices 2310, or apart from the local memory and the bulk storage devices. It should be appreciated that the data processing system 2300 may further execute an operating system (not shown in FIG. 10) that can facilitate execution of the application 2318. The application 2318, being implemented in the form of executable program code, can be executed by the data processing system 2300, e.g., by the processor 2302. Responsive to executing the application, the data processing system 2300 may be configured to perform one or more operations or method steps described herein.

Input/output (I/O) devices depicted as an input device 2312 and an output device 2314, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 2314 may be any type of screen display, such as plasma display, liquid crystal display (LCD), organic light emitting diode (OLED) display, electroluminescent (EL) display, or any other indicator, such as a dial, barometer, or LEDs. In some implementations, the system may include a driver (not shown) for the output device 2314. Input and/or output devices 2312, 2314 may be coupled to the data processing system either directly or through intervening I/O controllers.

In an embodiment, the input and the output devices may be implemented as a combined input/output device (illustrated in FIG. 10 with a dashed line surrounding the input device 2312 and the output device 2314). An example of such a combined device is a touch sensitive display, also sometimes referred to as a "touch screen display" or simply "touch screen". In such an embodiment, input to the device may be provided by a movement of a physical object, such as e.g., a stylus or a finger of a user, on or near the touch screen display.

A network adapter 2316 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 2300, and a data transmitter for transmitting data from the data processing system 2300 to said systems, devices and/or networks. Modems, cable modems, and Ethernet cards are examples of different types of network adapter that may be used with the data processing system 2300.

EXAMPLES

Example 1 includes an apparatus including an envelope regulator circuit to process, based on a parameterized model, an input signal to generate an envelope regulated signal; a digital predistortion (DPD) actuator circuit to process the envelope regulated signal and the input signal based on DPD coefficients associated with a nonlinearity characteristic of a nonlinear component; and a DPD adaptation circuit to update the DPD coefficients based on a feedback signal indicative of an output of the nonlinear component.

In Example 2, the apparatus of example 1 can optionally include where the nonlinear component includes a power amplifier, and where the parameterized model is associated with a drain inductor resonance of the power amplifier.

In Example 3, the apparatus of any one of examples 1-2 can optionally include where the envelope regulator circuit includes a gain regulation model associated with a voltage variation of the nonlinear component; and the apparatus further includes a control block to configure, based on the parameterized model, the gain regulation model.

In Example 4, the apparatus any one of examples 1-3 can optionally include where the gain regulation model in the envelope regulator circuit is based on a drain inductor resonance of the nonlinear component.

In Example 5, the apparatus any one of examples 1-4 can optionally include where the gain regulation model in the envelope regulator circuit includes a lookup table (e.g., a 2D LUT) that maps the voltage variation of the nonlinear component and an envelope (e.g., instantaneous envelope) of the input signal to a gain value.

In Example 6, the apparatus any one of examples 1-5 can optionally include where the envelope regulator circuit further includes a filter upstream of the gain regulation model; and the control block further configures the filter based on the parameterized model.

In Example 7, the apparatus any one of examples 1-6 can optionally include where the filter models at least one of an input signal envelope or an input voltage variation associated with the nonlinear component.

In Example 8, the apparatus any one of examples 1-7 can optionally include where the envelope regulator circuit further includes a downsampler upstream of the filter; and the control block further configures the downsampler based on the parameterized model.

In Example 9, the apparatus any one of examples 1-8 can optionally include where the envelope regulator circuit further includes an upsampler downstream of the filter; and the control block further configures the upsampler based on the parameterized model.

In Example 10, the apparatus any one of examples 1-9 can optionally include where the envelope regulator circuit includes a first path including a first downampler, a first filter, a first upsampler, and a first voltage variation and signal envelope to gain mapping table; and a second path in parallel with the first path, the second path including a second downsampler, a second filter, a second upsampler, and a second voltage variation and signal envelope to gain mapping table.

In Example 11, the apparatus any one of examples 1-10 can optionally include where the first filter is different from the second filter.

In Example 12, the apparatus any one of examples 1-11 can optionally include where the first voltage variation and signal envelope to gain mapping table filter is different from the second voltage variation and signal envelope to gain mapping table.

In Example 13, the apparatus any one of examples 1-12 can optionally include where at least one of the first downsampler and the second downsampler are based on different downsampling factors; or the first upsampler and the second upsampler are based on different upsampling factors.

In Example 14, the apparatus any one of examples 1-13 can optionally include where the control block further configures at least one of a lookup table or a memory term selection of the DPD actuator circuit based on the parameterized model.

In Example 15, the apparatus any one of examples 1-14 can optionally include where the DPD adaptation circuit updates the DPD coefficients further based on the parameterized model.

In Example 16, the apparatus any one of examples 1-15 can optionally include where the parameterized model is trained based on a mapping between each processing unit in the envelope regulator circuit, the DPD actuator circuit, and the DPD adaptation circuit and a different one of a plurality of differentiable building blocks; and at least one of an input data set collected on a target hardware, an output data set collected on the target hardware.

In Example 17, the apparatus of any one of examples 1-16 can optionally include where the parameterized model used by the envelope regulator circuit is trained using machine learning over the plurality of differentiable building blocks.

Example 18 includes a method including receiving a digital input signal; generating an envelope regulated signal based on the digital input signal, where the generating includes mapping, based on a parametrized model, an envelope of the input signal and a gain variation associated with a power amplifier to one or more gain values; performing digital predistortion (DPD) on the envelope regulated signal to generate a predistorted signal; and outputting the predistorted signal.

In Example 19, the method of example 18 can optionally include where the mapping the envelope of the input signal and the gain variation associated with the power amplifier to the one or more gain values include filtering the input signal using a filter to generate a filtered signal, where coefficients of the filter is based on the parametrized model; and determining the one or more gain values from a two-dimensional lookup table based on an envelope (e.g., instantaneous envelope) of the filtered signal and an envelope (e.g., instantaneous envelope) of the input signal.

In Example 20, the method of any one of examples 18-19 can optionally include where a response of the filter is associated with the envelope of the input signal and the gain variation associated with the power amplifier.

In Example 21, the method of any one of examples 18-20 can optionally include where the mapping the envelope of the input signal and the gain variation associated with the power amplifier to the one or more gain values includes downsampling the input signal before the filtering; and upsampling the filtered signal before determining the one or more gain values.

In Example 22, the method of any one of examples 18-21 can optionally include where generating the envelope regulated signal further includes multiplying the input signal with the one or more gain values.

Example 23 includes a method including receiving, by a computer-implemented system, a data set including one more data pairs, each including an input signal and an observed signal associated with a nonlinear component; training, based on the data set, a parameterized model associated with an envelope regulation for the nonlinear component, where the training includes updating at least one parameter of the parameterized model associated with configuring a plurality of processing units associated with an envelope regulator circuit; and outputting, based on the training, one or more configurations for the plurality of processing units associated with the envelope regulator circuit.

In Example 24, the method of example 23 can optionally include generating the parameterized model, where the generating includes generating a mapping between each of the plurality of processing units associated with the envelope regulator circuit and one of a plurality of differentiable functional blocks.

In Example 25, the method of any one of examples 23-24 can optionally include where the envelope regulation for the nonlinear component includes a sequence of operations; and the method further includes calculating a parameter for each operation in the sequence of operations.

In Example 26, the method of any one of examples 23-25 can optionally include where the calculating the parameter for each operation in the sequence of operations is further based on a backpropagation process and a loss function.

In Example 27, the method of any one of examples 23-26 can optionally include where the sequence of operations of the envelope regulation for the nonlinear component includes a power amplifier voltage variation and an input signal envelope to gain mapping operation.

In Example 28, the method of any one of examples 23-27 can optionally include where the sequence of operations of the envelope regulation for the nonlinear component includes a filtering operation.

In Example 29, the method of any one of examples 23-28 can optionally include where the sequence of operations of the envelope regulation for the nonlinear component includes a downsampling operation and an upsampling operation.

In Example 30, the method of any one of examples 23-29 can optionally include where the outputting the one or more configurations includes outputting information associated with a two-dimensional lookup table that maps voltage gain variations and input signal envelope associated with the nonlinear component to gain values.

In Example 31, the method any one of examples 23-30 can optionally include where the outputting the one or more configurations includes outputting information associated with a filter that models a voltage variation of the nonlinear component based on an input signal envelope.

Example 32 includes a computer-implemented system (e.g., the parameterized model training system 172 and/or the data processing system 2300 of FIG. 10) including one or more non-transitory computer-readable media storing instructions, when executed by one or more processing units, cause the one or more processing units to perform the method of any one of examples 23-31.

Example 33 includes an apparatus including means for performing the method of any one of examples 18-22.

Example 33 includes an apparatus including means for performing the method of any one of examples 23-31.

Variations and Implementations

Various embodiments of performing DPD with neural-network-assisted envelope regulation are explained herein with reference to the "input signals for PAs" being drive signals for the PAs, i.e., signals generated on the basis of the input signal x, described herein, to which the DPD arrangement applies predistortion based on the DPD coefficients. However, in other embodiments of DPD with neural-network-assisted envelope regulation, the "input signals for PAs" may be bias signals used to bias the N PAs. Thus, embodiments of the present disclosure also cover DPD arrangements with neural-network-assisted envelope regulation similar to the ones described herein and illustrated in the drawings, except that, instead of modifying the drive signals for the PAs, the DPD arrangements with neural-network-assisted envelope regulation may be configured to modify the bias signals for the PAs, which may be done based on control signals generated by a DPD adaptation circuit (e.g., the DPD adaptation circuit, described herein), where the output of a PA is based on the bias signal used to bias the PA. In other aspects of the present disclosure, both drive signals and bias signals for PAs may be adjusted as described herein to implement of DPD using neural networks.

While some of the descriptions are provided herein with reference to PAs, in general, various embodiments of DPD with neural-network-assisted envelope regulation, presented herein, are applicable to amplifiers other than PAs, such as low-noise amplifiers, variable gain amplifiers, etc., as well as to nonlinear electronic components of RF transceivers (i.e., components that may exhibit nonlinear behavior) other than amplifiers. Furthermore, while some of the descriptions are provided herein with reference to millimeter-wave/5G technologies, in general, various embodiments of DPD with neural-network-assisted envelope regulation, presented herein, are applicable to wireless communication systems of any technology or standard other than millimeter-wave/5G, to any wireless RF systems other than wireless communication systems, and/or to RF systems other than wireless RF systems.

While embodiments of the present disclosure were described above with references to exemplary implementations as shown in FIGS. 1A-1C, 2-6, 7A-7B, and 8-10, a person skilled in the art will realize that the various teachings described above are applicable to a large variety of other implementations.

In certain contexts, the features discussed herein can be applicable to automotive systems, safety-critical industrial applications, medical systems, scientific instrumentation, wireless and wired communications, radio, radar, industrial process control, audio and video equipment, current sensing, instrumentation (which can be highly precise), and other digital-processing-based systems.

In the discussions of the embodiments above, components of a system, such as multiplexers, multipliers, adders, delay taps, filters, converters, mixers, and/or other components can readily be replaced, substituted, or otherwise modified in order to accommodate particular circuit needs. Moreover, it should be noted that the use of complementary electronic devices, hardware, software, etc., offer an equally viable option for implementing the teachings of the present disclosure related to applying model architecture search for hardware configurations, in various communication systems.

Parts of various systems for using model architecture search techniques for hardware configurations as proposed herein can include electronic circuit to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuit can operate in analog domain, digital domain, or in a mixed-signal domain. In some instances, the processor may be configured to carry out the functions described herein by executing one or more instructions stored on a non-transitory computer-readable storage medium.

In one example embodiment, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present figures may be implemented as stand-alone modules (e.g., a device with associated components and circuit configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components of the apparatuses and/or RF transceiver shown in FIGS. 1-5 and 10) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present figures may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Also, as used herein, including in the claims, "or" as used in a list of items (for example, a list of items prefaced by a phrase such as "at least one of" or "one or more of") indicates an inclusive list such that, for example, a list of [at least one of A, B, or C] means A or B or C or AB or AC or BC or ABC (i.e., A and B and C).

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Also, as used herein, the terms "substantially," "approximately," "about," etc., may be used to generally refer to being within +/−20% of a target value, e.g., within +/−10% of a target value, based on the context of a particular value as described herein or as known in the art.

Numerous other changes, substitutions, variations, alterations, and modifications may be ascertained to one skilled in the art and it is intended that the present disclosure encompass all such changes, substitutions, variations, alterations, and modifications as falling within the scope of the examples and appended claims. Note that all optional features of the apparatus described above may also be implemented with respect to the method or process described herein and specifics in the examples may be used anywhere in one or more embodiments.

The invention claimed is:

1. An apparatus comprising:
an envelope regulator circuit to compensate a baseband input signal for a gain oscillation of a power amplifier caused by a power supply resonance, based on a parameterized model associated with the gain oscillation of the power amplifier, to generate an envelope regulated signal that is precompensated;
a digital predistortion (DPD) actuator circuit to receive and process the envelope regulated signal and the baseband input signal based on DPD coefficients associated with a nonlinear characteristic of the power amplifier; and
a DPD adaptation circuit to update the DPD coefficients based on a feedback signal indicative of an output of the power amplifier.

2. The apparatus of claim 1, wherein the parameterized model is associated with a drain inductor resonance of the power amplifier.

3. The apparatus of claim 1, wherein:
the envelope regulator circuit comprises a finite impulse response filter to model the gain oscillation of the power amplifier; and
the apparatus further comprises:
a control block to configure, based on the parameterized model, the finite impulse response filter.

4. The apparatus of claim 3, wherein the finite impulse response filter models a drain inductor resonance of the power amplifier.

5. The apparatus of claim 3, wherein the envelope regulator circuit includes a lookup table that maps the gain oscillation of the power amplifier and an envelope of the baseband input signal to a gain value.

6. The apparatus of claim 5, wherein:
the control block further configures the lookup table based on the parameterized model.

7. The apparatus of claim 3, wherein:
the envelope regulator circuit further comprises a downsampler upstream of the finite impulse response filter and an upsampler downstream of the finite impulse response filter; and
the control block further configures the downsampler and the upsampler based on the parameterized model.

8. The apparatus of claim 1, wherein the envelope regulator circuit comprises:
a first path comprising a first downampler, a first filter, a first upsampler, and a first voltage variation and signal envelope to gain mapping table; and
a second path in parallel with the first path, the second path comprising a second downsampler, a second filter, a second upsampler, and a second voltage variation and signal envelope to gain mapping table.

9. The apparatus of claim 1, wherein the envelope regulator circuit is to generate the envelope regulated signal by at least mapping the the gain oscillation of the power amplifier and an envelope of the baseband input signal to a gain value.

10. A method comprising:
receiving a digital input signal;
generating an envelope regulated signal that is compensated for drain inductor resonance of a power amplifier based on the digital input signal, wherein the generating comprises mapping, based on a parametrized model, an envelope of the digital input signal and a gain variation associated with the drain inductor resonance of the power amplifier to one or more gain values;
performing digital predistortion (DPD) on the envelope regulated signal to generate a predistorted signal; and
outputting the predistorted signal.

11. The method of claim 10, wherein:
the mapping the envelope of the digital input signal and the gain variation associated with the drain inductor resonance of the power amplifier to the one or more gain values comprises:
filtering the digital input signal using a filter to generate a filtered signal, wherein coefficients of the filter are based on the parametrized model; and
determining the one or more gain values from a two-dimensional lookup table based on an envelope of the filtered signal and an envelope of the digital input signal; and
the generating the envelope regulated signal further comprises:
multiplying the digital input signal with the one or more gain values.

12. The method of claim 11, wherein the mapping the envelope of the digital input signal and the gain variation associated with the drain inductor resonance of the power amplifier to the one or more gain values comprises:
downsampling the digital input signal before the filtering; and
upsampling the filtered signal before determining the one or more gain values.

13. A method comprising:
receiving, by a computer-implemented system, a data set including one more data pairs, each including an baseband input signal and an observed signal associated with a nonlinear component;
training, based on the data set, a parameterized model associated with an envelope regulation that compensates for a gain oscillation of the nonlinear component caused by a power supply resonance, wherein the training comprises updating at least one parameter of the parameterized model associated with configuring a plurality of processing units associated with an envelope regulator circuit, wherein the envelope regulation circuit has an output connected to an input of a digital predistortion circuit; and
outputting, based on the training, one or more configurations for the plurality of processing units associated with the envelope regulator circuit.

14. The method of claim 13, further comprising:
generating the parameterized model, wherein the generating comprises generating a mapping between each of the plurality of processing units associated with the envelope regulator circuit and one of a plurality of differentiable functional blocks.

15. The method of claim 13, wherein
the envelope regulation that compensates for gain oscillation of the nonlinear component includes a sequence of operations; and
the method further comprises:
calculating a parameter for each operation in the sequence of operations.

16. The method of claim 15, wherein the calculating the parameter for each operation in the sequence of operations is further based on a backpropagation process and a loss function.

17. The method of claim 15, wherein the sequence of operations of the envelope regulation that compensates for gain oscillation of the nonlinear component comprises a power amplifier voltage variation and an input signal envelope to gain mapping operation.

18. The method of claim 15, wherein the sequence of operations of the envelope regulation that compensates for gain oscillation of the nonlinear component comprises a filtering operation.

19. The method of claim 15, wherein the sequence of operations of the envelope regulation that compensates for gain oscillation of the nonlinear component comprises a downsampling operation and an upsampling operation.

20. The method of claim 13, wherein the outputting the one or more configurations comprises:
outputting information associated with a two-dimensional lookup table that maps voltage gain variations and input signal envelope associated with the nonlinear component to gain values; and
outputting information associated with a filter that models the voltage variation of the nonlinear component based on an input signal envelope.

* * * * *